(12) United States Patent
Huang et al.

(10) Patent No.: US 10,622,161 B2
(45) Date of Patent: Apr. 14, 2020

(54) NARROW BAND PEROVSKITE SINGLE CRYSTAL PHOTODETECTORS WITH TUNABLE SPECTRAL RESPONSE

(71) Applicant: NUtech Ventures, Lincoln, NE (US)

(72) Inventors: Jinsong Huang, Lincoln, NE (US); Yanjun Fang, Lincoln, NE (US)

(73) Assignee: Nutech Ventures, Lincoln, NE (US)

( * ) Notice: Subject to any disclaimer, the term of this patent is extended or adjusted under 35 U.S.C. 154(b) by 331 days.

(21) Appl. No.: 15/400,722

(22) Filed: Jan. 6, 2017

(65) Prior Publication Data
US 2018/0374650 A1 Dec. 27, 2018

Related U.S. Application Data

(60) Provisional application No. 62/275,620, filed on Jan. 6, 2016.

(51) Int. Cl.
*H01G 9/20* (2006.01)
*H01L 51/42* (2006.01)
(Continued)

(52) U.S. Cl.
CPC ......... *H01G 9/2009* (2013.01); *H01G 9/0036* (2013.01); *H01L 27/305* (2013.01);
(Continued)

(58) Field of Classification Search
CPC . H01L 51/441; H01L 51/424; H01L 51/0047; H01L 51/001; H01L 27/307; H01L 51/442; H01L 27/305; H01L 51/4206; H01L 51/4226; H01L 51/0077; H01G 9/2009
See application file for complete search history.

(56) References Cited

U.S. PATENT DOCUMENTS 9,391,287 B1 * 7/2016 Huang ................ H01L 51/4213
9,985,231 B2 5/2018 Huang et al.
(Continued)

FOREIGN PATENT DOCUMENTS

WO WO 2013/171517 A1 11/2013
WO WO 2014/045021 A1 3/2014

OTHER PUBLICATIONS

U.S. Appl. No. 15/487,988, filed Oct. 19, 2017, Zhu et al.
(Continued)

*Primary Examiner* — Jasmine J Clark
(74) *Attorney, Agent, or Firm* — Leydig, Voit & Mayer, Ltd.; Gerald T. Gray

(57) ABSTRACT

Photoelectronic devices using perovskite single-crystal materials having a narrow spectral response, e.g., with a full-width-at-half-maximum response of less than about 20 nm, are provided. The response spectra are continuously (in frequency band) settable or tunable, e.g., from blue to red, by changing the halide composition and thus the band gap of the single crystals. The narrow-band response can be explained by the strong surface charge recombination of the excess carriers close to the crystal surfaces generated by short wavelength light. The excess carriers generated by below-band gap excitation locate away from the surfaces and can be much more efficiently collected by the electrodes to produce a photocurrent.

24 Claims, 14 Drawing Sheets

(51) Int. Cl.
H01L 51/44 (2006.01)
H01G 9/00 (2006.01)
H01L 27/30 (2006.01)
H01L 51/00 (2006.01)

(52) U.S. Cl.
CPC ...... *H01L 51/4206* (2013.01); *H01L 51/4226* (2013.01); *H01L 51/4246* (2013.01); *H01L 51/4253* (2013.01); *H01L 51/442* (2013.01); *H01L 51/0035* (2013.01); *H01L 51/0036* (2013.01); *H01L 51/0037* (2013.01); *H01L 51/0077* (2013.01)

(56) References Cited

U.S. PATENT DOCUMENTS

| | | |
|---|---|---|
| 10,199,579 B2 | 2/2019 | Huang |
| 2015/0136232 A1 | 5/2015 | Snaith et al. |
| 2016/0020420 A1* | 1/2016 | Lee ............ H01L 51/102 136/256 |
| 2016/0248028 A1* | 8/2016 | Huang ............ H01L 51/0002 |
| 2016/0251383 A1 | 9/2016 | Zhu et al. |
| 2017/0089128 A1 | 3/2017 | Wheeler |
| 2017/0186559 A1 | 6/2017 | Zhu et al. |
| 2017/0244057 A1 | 8/2017 | Zhu et al. |
| 2017/0342316 A1 | 11/2017 | Luther et al. |
| 2018/0005762 A1 | 1/2018 | Zhu et al. |
| 2018/0029005 A1 | 2/2018 | Sookraj |
| 2018/0105543 A1 | 4/2018 | Zhu et al. |
| 2018/0151813 A1 | 5/2018 | Zhu et al. |
| 2018/0277695 A1 | 9/2018 | Garten et al. |
| 2018/0330891 A1 | 11/2018 | Wheeler et al. |
| 2018/0350523 A1 | 12/2018 | Schulz et al. |
| 2018/0351019 A1 | 12/2018 | Zhu et al. |
| 2018/0374651 A1 | 12/2018 | Blackburn et al. |

OTHER PUBLICATIONS

Higashi et al., "Enhancing spectral contrast in organic red-light photodetectors based on a light-absorbing and exciton-blocking layered system" Journal of Applied Physics 108, Aug. 3, 2010, 5 pages.
Cicek et al., "Al$_x$Ga$_{1-x}$N-based back-illuminated solar-blind photodetectors with external quantum efficiency of 89%" Applied Physics Letters 103, Nov. 5, 2013, 4 pages.
Sobhani et al., "Narrowband photodetection in the near-infrared with a plasmon-induced hot electron device" Nature Communications, Mar. 27, 2013.
Konstantatos et al., "Hybrid graphene-quantum dot phototransistors with ultrahigh gain" Nature Nanotechnology vol. 7, May 6, 2012, pp. 363-368.
Kim et al., "A high performance semitransparent organic photodetector with green color selectivity" Applied Physics Letters 105 213301 (2014), Nov. 26, 2014.
Xiao et al., "Efficient, high yield perovskite photovoltaic devices grown by interdiffusion of solution-processed precursor stacking layers" Energy & Environmental Science 2014, pp. 2619-2623.
Burschka et al., "Sequential deposition as a route to high-performance perovskite-sensitized solar cells" Nature 12340, Jul. 10, 2013, pp. 316-319.
Liu et al., "Efficient planar heterojunction perovskite solar cells by vapour deposition" Nature 12509, Sep. 19, 2013, pp. 395-398.
Zhou et al., "Interface engineering of highly efficient perovskite solar cells" Science vol. 345 Issue 6196, Aug. 1, 2014, pp. 542-546.
Tan et al., "Bright light-emitting diodes based on organometal halide perovskite" Nat. Nano. 9, 2014, pp. 687-692.
Mei et al., "A hole-conductor—free, fully printable mesoscopic perovskite solar cell with high stability" Science vol. 345 Issue 6194, Jul. 18, 2014, pp. 295-298.

Jeon et al., "Compositional engineering of perovskite materials for high-performance solar cells" Nature vol. 517, Jan. 22, 2015, pp. 476-480.
Luo et al., "Water photolysis at 12.3% efficiency via perovskite photovoltaics and Earth-abundant catalysts" Science vol. 345 Issue 6204, Sep. 26, 2014, pp. 1593-1596.
Im et al., "Growth of CH3NH3PbI3 cuboids with controlled size for high-efficiency perovskite solar cells" Nat. Nano. 9, 2014, pp. 927-932.
Xing et al., "Low-temperature solution-processed wavelength-tunable perovskites for lasing" Nature Materials doi:10.1038/nmat3911, Mar. 16, 2014.
Zhu et al., "Lead halide perovskite nanowire lasers with low lasing thresholds and high quality factors" Nature Materials doi:10.1038/nmat4271, Jul. 6, 2014.
Heo et al., "Efficient inorganic-organic hybrid heterojunction solar cells containing perovskite compound and polymeric hole conductors" Nature Photonics doi:10.1038, May 5, 2013.
Liu et al., "Perovskite solar cells with a planar heterojunction structure prepared using room-temperature solution processing techniques" Nature Photonics doi:10.1038, Dec. 22, 2013.
Malinkiewicz et al., "Perovskite solar cells employing organic charge-transport layers" Nature Photonics doi:10.1038, Dec. 22, 2013.
Marchioro et al., "Unravelling the mechanism of photoinduced charge transfer processes in lead iodide perovskite solar cells" Nature Photonics doi:10.1038, Jan. 19, 2014, pp. 250-255.
Lin et al., "Electro-optics of perovskite solar cells" Nature Photonics doi:10.1038, Dec. 1, 2014.
Xing et al., "Long-Range Balanced Electron- and Hole-Transport Lengths in Organic-Inorganic CH3NH3PbI3" Science vol. 342, Oct. 18, 2013, pp. 344-347.
Green et al., "The emergence of perovskite solar cells" Nature Photonics vol. 8, Jul. 2014, pp. 506-514.
Shao et al., "Origin and elimination of photocurrent hysteresis by fullerene passivation in CH3NH3PbI3 planar heterojunction solar cells" Nature Communications 5, Dec. 15, 2014.
Wang et al., "Large fill-factor bilayer iodine perovskite solar cells fabricated by a low-temperature solution-process" Energy & Environmental Science 7, 2014, pp. 2359-2365.
Dong et al., "Electron-hole diffusion lengths > 175 μm in solution-grown CH3NH3PbI3 single crystals" Sciencexpress, Jan. 29, 2015.
Shi et al., "Low trap-state density and long carrier diffusion in organolead trihalide perovskite single crystals" Science 347, Jan. 30, 2015.
Knop et al., "Alkylammonium lead halides. Part 2. CH3NH3PbX3 (X=Cl, Br, I) perovskites: cuboctahedral halide cages with isotropic cation reorientation" Can. J. Chem. 68, 1990, pp. 412-4222.
Noh et al., "Chemical Management for Colorful, Efficient, and Stable Inorganic-Organic Hybrid Nanostructured Solar Cells" Nano Letters 13, 2013, pp. 1764-1769.
Armin et al., "Narrowband light detection via internal quantum efficiency manipulation of organic photodiodes" Nature Communications 6, Feb. 27, 2015.
Xiao et al., "Giant switchable photovoltaic effect in organometal trihalide perovskite devices" Nature Materials, Dec. 8, 2014.
Guo et al., "A nanocomposite ultraviolet photodetector based on interfacial trap-controlled charge injection" Nature Nanotechnology 7, Nov. 11, 2012, pp. 798-802.
Dandin et al., "Optical filtering technologies for integrated fluorescence sensors" Lab Chip 7, Jul. 13, 2007, pp. 955-977.
Yuan et al., "Ultrahigh gain, low noise utraviolet photodetectors with highly aligned organic crystals" Advanced Optical Materials 2016, Nov. 17, 2015, pp. 264-270.
Ren et al., "Band-Selective Infrared Photodetectors with Complete-Composition-Range InAs$_x$P$_{1-x}$ Alloy Nanowires" Advanced Optical Materials 2014 26, Sep. 25, 2014, pp. 7444-7449.
Dong et al., "High-Gain and Low-Driving-Voltage Photodetectors Based on Organolead Triiodide Perovskites" Advanced Optical Materials 2015 27, Jan. 21, 2015, pp. 1912-1918.
Stoumpos et al., "Semiconducting Tin and Lead Iodide Perovskites with Organic Cations: Phase Transitions, High Mobilities, and

(56) References Cited

OTHER PUBLICATIONS

Near-Infrared Photoluminescent Properties" Inorganic Chemistry 2013 52, Jul. 8, 2013, pp. 9019-9038.

Stranks et al., "Electron-Hole Diffusion Lengths Exceeding 1 Micrometer in an Organometal Trihalide Perovskite Absorber" Science vol. 342, Oct. 18, 2013, pp. 341-344.

Fang et al., "Resolving Weak Light of Sub-picowatt per Square Centimeter by Hybrid Perovskite Photodetectors Enabled by Noise Reduction" Advanced Materials 2015 27, Mar. 18, 2015, pp. 2804-2810.

Olschner et al., "Charge carrier transport properties in thallium bromide crystals used as radiation detectors" IEEE Transactions on Nuclear Science vol. 37 No. 3, Jun. 1990, pp. 1162-1164.

Androulakis et al., "Dimensional Reduction: A Design Tool for New Radiation Detection Materials" Advanced Materials 2011 23, Aug. 9, 2011, pp. 4163-4167.

Schmidt et al., "Surface passivation of high-efficiency silicon solar cells by atomic-layer-deposited Al2O3" Progress in Photovoltaics: Research and Applications 16, Mar. 3, 2008, pp. 461-466.

Wei et al., "Sensitive X-ray detectors made of methylammonium lead tribromide perovskite single crystals" Nature Photonics, D0I:10.1038/NPHOTON.2016.41, Mar. 21, 2016.

\* cited by examiner

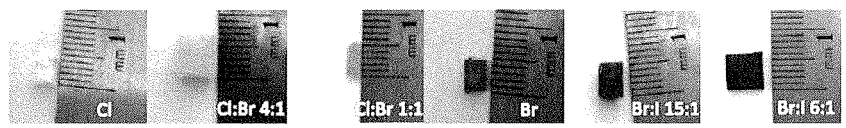
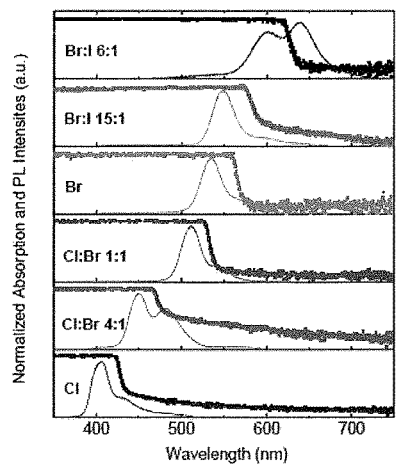
FIG. 1B
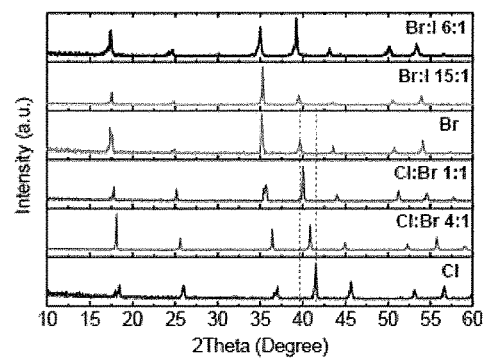
FIG. 1C
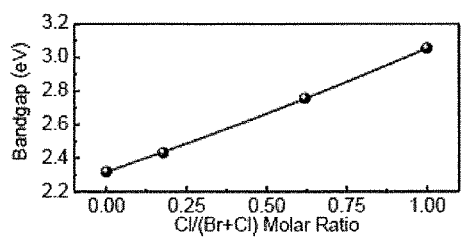
FIG. 1D
FIG. 1A

NARROW BAND PEROVSKITE SINGLE CRYSTAL PHOTODETECTORS WITH TUNABLE SPECTRAL RESPONSE

CROSS-REFERENCE TO RELATED APPLICATIONS

The present application claims the benefit under 35 U.S.C. § 119(e) of U.S. Provisional Application Ser. No. 62/275,620, filed Jan. 6, 2016, and titled "NARROW BAND PEROVSKITE SINGLE CRYSTAL PHOTODETECTORS WITH TUNABLE SPECTRAL RESPONSE," which is hereby incorporated by reference in its entirety.

FEDERALLY SPONSORED RESEARCH OR DEVELOPMENT

This invention was made with Government support under Grant Number HDTRA1-14-1-0030, awarded by the Defense Threat Reduction Agency, Grant Number HDTRA1-10-1-0098, awarded by the Defense Threat Reduction Agency, and Grant Number N00014-12-1-0556 awarded by the Office of Naval Research. The Government has certain rights in this invention.

BACKGROUND

The present disclosure relates generally to photoresponsive materials and photoelectronic apparatus including such photoresponsive materials, and more specifically to photodetectors including perovskite materials having a narrow band response.

Spectrally selective photodetection is useful in biomedical sensing, imaging, defense, and surveillance applications where only a small spectral range of light needs to be detected while other frequency ranges, usually background or environmental radiation, need to be suppressed. Narrow band photodetection is usually realized either by combining broad-band photodetectors with band-pass filters, using photoactive materials with narrow band absorption, or by intentionally enhancing absorption in a certain wavelength range by the plasmonic effect. The first form of detection system suffers from the high cost of filters as well as complicated optical system design and integration. Moreover, current commercial optical filters cannot meet the needs of many applications due to their inherent limitations. For example, interference optical filters are susceptible to side peaks, and are very sensitive to surface contamination or scratches. For the narrow band absorption materials, despite their successful application in short wavelength photodetectors using wide bandgap semiconductors as the active materials, such as visible-blind or solar-blind ultraviolet (UV) photodetectors, it remains challenging to realize narrow band visible or infrared (IR) detection. The plasmonic enhanced absorption also has limits in the operational spectral range and non-suppressed absorption in other non-plasmonic wavelength ranges. Therefore, it is desirable to provide intrinsically narrow band photodetection materials and devices with a settable or tunable response range.

BRIEF SUMMARY

The present embodiments advantageously provide a new design paradigm for narrow-band photoelectronic devices using single halide and mixed-halide perovskite materials. Photodetectors using such materials are particularly advantageous for applications where background noise emission should be suppressed. The present embodiments provide perovskite single-crystal photodetectors and polycrystalline perovskite photodetectors having a narrow spectral response, e.g., with a full-width-at-half-maximum response of less than about 20 nm. The response spectra are continuously (in frequency band) settable or tunable, e.g., from UV to IR, and in particular within the visible range (e.g., blue to red), by changing the halide composition and thus the bandgap of the perovskite material. The narrow-band photodetection can be explained by the strong surface charge recombination of the excess carriers close to the crystal surfaces generated by short wavelength light. The excess carriers generated by below-bandgap excitation locate away from the surfaces and can be much more efficiently collected by the electrodes to produce a photocurrent. An applied electric-field, or bias, may assist with photocurrent production in some embodiments.

In various embodiments, optoelectronic devices, such as photodetectors, include tuned organolead trihalide perovskite single crystals or polycrystalline perovskite films as the photoactive material. In certain embodiments, for example, single-halide perovskite single crystals or polycrystalline perovskite films, or $MAPbBr_{3-x}Cl_x$ or $MAPbI_{3-x}Br_x$ mixed-halide perovskite single crystals or polycrystalline perovskite films with the absorption edge continuously tunable or settable from the blue to the red frequency response region are used as the photoactive material. Using these perovskite materials as the photoactive materials in the optoelectronic devices, a narrow band photoresponse with a tunable spectral response from blue to red is realized. Based on the charge collection efficiency modeling and experimentally measured photoresponse spectra, it is demonstrated that the surface charge recombination is responsible for the observed narrow band photodetection phenomenon.

According to an embodiment, a photoelectronic device is provided that includes a single crystal perovskite (SCP) having a halide composition selected to provide a narrow-band photodetection response for the SCP of less than about 20 nm full-width-at-half-maximum (FWHM) for light impinging on the SCP having a specific wavelength (e.g., nominal peak value) within a wavelength range ranging from UV to IR. In certain aspects, the SCP has a thickness of between about 100 nm and about 1 μm, or between about 1 μm and about 0.05 mm, or between around 0.05 mm to about 2 mm or more (e.g., less than 1 cm, or less than 10 cm). In certain aspects, the SCP is selected from the group consisting of a single-halide perovskite single crystal, a $MAPbBr_{3-x}Cl_x$ mixed-halide perovskite single crystal and a $MAPbI_{3-x}Br_x$ mixed-halide perovskite single crystal, where x may be an integer or fraction (e.g., decimal number) less than 3. In certain aspects, the SCP is a perovskite having a structure of $AMX_3$, wherein A is methylammonium ($CH_3NH_3^+$), $Cs^+$, formamidinum ($H_2NCHNH_2^+$) or a mixture thereof (e.g., all three or any two), M is a metal cation (e.g., $Pb^{2+}$, $Sn^{2+}$ or other dicovalent ions, or a mixture thereof), and X is a halide anion (e.g., $Cl^-$, $Br^-$, or $I^-$), thiocyanate ($SCN^-$) or mixture thereof.

In certain aspects, a first buffer layer is disposed between the SCP and the first electrode, and a second buffer layer is disposed between the SCP and the second electrode, wherein the first buffer layer has a higher hole conductivity than the second buffer layer, and the second buffer layer has a higher electron conductivity than the first buffer layer. In certain aspects, the first buffer layer comprises at least one of poly(3,4-ethylenedioxithiophene) (PEDOT) doped with poly(styrene sulfonicacid) (PSS), 4,4' bis[(ptrichlorosilylpropylphenyl)phenylaminoThiphenyl (TPD-Si2), polyvinylcarbazole (PVK), poly(3-hexylthiophene) (P3HT), poly (3-hexyl-2,5-thienylene vinylene) (P3HTV), copper phthalocyanine (CuPc), poly[3,4-(1hydroxymethyl)ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctylfluorene)-co-N-(4-(1-methylpropyl)phenyl)diphenylamine] (PFT), 4,4'-bis[(p-trichlorosilylpropylphenyl) phenylamino]biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, $VO_x$, $MoO_3$, $WO_3$, $ReO_3$, $NiO_x$, $AgO_x$/PEDOT:PSS, $Cu_2O$, CuSCN/P3HT, or Au nanoparticles. In certain aspects, the second buffer layer includes at least one of LiF, CsF, $LiCoO_3$, $CS_2CO_3$, $TiO_x$, $TiO_2$, $SnO_x$, ZnO, $Al_2O_3$, CaO, bathocuproine (BCP), copper phthalocyanine (CuPc), pentacene, pyronin B, [6,6]-phenyl C61-butyric acid methyl ester (PCBM), [6,6]-phenyl C71-butyric acid methyl ester (PC70BM), pentadecafluorooctyl phenyl-C60-butyrate (F-PCBM), C60, C60/LiF, ZnO/PCBM, ZnO/cross-linked fullerene derivative (C-PCBSD), single walled carbon nanotubes (SWCNT), poly(ethylene glycol) (PEG), poly(dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBTI5), fluorene alternating and random copolymer bearing cationic groups in the alkyl side chains (PFP-NBr), or poly(ethylene oxide) (PEO).

According to another embodiment, a photodetector device is provided that includes a polycrystalline perovskite (PCP) film having a halide composition selected to provide a narrow-band photodetection response of less than about 20 nm FWHM for light impinging on the perovskite thin film having a specific wavelength (e.g., nominal peak value) within a wavelength range ranging from UV to IR. In certain aspects, the perovskite thin film has a thickness of between about 100 nm and about 1 or between about 1 μm and about 20 μm or more (e.g., less than about 1 mm). In certain aspects, the perovskite film is selected from the group consisting of a single-halide perovskite PCP film, a $MAPbBr_{3-x}Cl_x$ mixed-halide perovskite PCP film and a $MAPbI_{3-x}Br_x$ mixed-halide perovskite PCP film, where x may be an integer or fraction (e.g., decimal number) less than 3. In certain aspects, the perovskite film is a perovskite having a structure of $AMX_3$, wherein A is methylammonium ($CH_3NH_3^+$), $Cs^+$, formamidinum ($H_2NCHNH_2^+$) or a mixture thereof, M is a metal cation (e.g., $Pb^{2+}$, $Sn^{2+}$ or other dicovalent ions, or a mixture thereof), and X is a halide anion (e.g., $Cl^-$, $Br^-$, or $I^-$), thiocyanate ($SCN^-$) or mixture thereof.

According to an embodiment, a photodetector device is provided, that includes a first electrode, a second electrode, and a single crystal perovskite (SCP) disposed between the first electrode and the second electrode. The SCP includes a halide composition selected to provide a narrow-band photodetection response for the SCP of less than about 20 nm full-width-at-half-maximum (FWHM) for light impinging on the SCP having a specific wavelength (e.g., nominal peak value) within a visible wavelength range. In certain aspects, the SCP has a thickness (between the first and second electrodes) of between about 100 nm and about 1 or between about 1 μm and about 0.05 mm, or between around 0.05 mm to about 2 mm or more (e.g., less than 1 cm, or less than 10 cm). In certain aspects, the first and second electrodes each have a thickness of between about 10 nm and about 100 nm or greater (e.g., less than about 200 nm, or less than about 1000 nm, or less than about 1 or less than about 1 mm, or less than about 1 cm), depending on the conductivity of the materials used. In certain aspects, the SCP is selected from the group consisting of a single-halide perovskite single crystal, a $MAPbBr_{3-x}Cl_x$ mixed-halide perovskite single crystal and a $MAPbI_{3-x}Br_x$ mixed-halide perovskite single crystal, where x may be an integer or fraction (e.g., decimal number) less than 3. In certain aspects, the SCP is a perovskite having a structure of $AMX_3$, wherein A is methylammonium ($CH_3NH_3^+$), $Cs^+$, formamidinum ($H_2NCHNH_2^+$) or a mixture thereof, M is a metal cation (e.g., $Pb^{2+}$, $Sn^{2+}$ or other dicovalent ions, or a mixture thereof), and X is a halide anion (e.g., $Cl^-$, $Br^-$, or $I^-$), thiocyanate ($SCN^-$) or mixture thereof. In certain aspects, the photodetector device further includes a thin layer of a material between the second electrode, which serves as an anode, and the SCP, wherein the thin layer of material enhances a defect density on or near a surface of the SCP proximal to the second electrode so as to enhance the number of charge traps on or near the surface of the SCP.

According to another embodiment, a method is provided for making a photodetector having a narrow-band photodetection response of less than about 20 nm full-width-at-half-maximum (FWHM) for light impinging on the photodetector having a specific wavelength (e.g., peak nominal wavelength) within a wavelength range including UV through IR, and in particular the visible wavelength range from blue to red. The method typically includes providing a first electrode layer, attaching a single crystal perovskite (SCP) or polycrystalline perovskite (PCP) film on or to the first electrode layer, wherein the SCP or PCP film includes a halide composition selected to provide a narrow-band photodetection response for the SCP or PCP film of less than about 20 nm full-width-at-half-maximum (FWHM) for light impinging on the SCP or PCP film having the specific visible wavelength, and forming a second electrode layer on the SCP or PCP film. In certain aspects, the second electrode layer is an anode, and the first electrode layer is a cathode. In certain aspects, attaching the SCP or PCP film on or to the first electrode layer includes attaching the SCP or PCP film to a preformed electrode layer. In certain aspects, the first electrode layer may be attached to or deposited on a substrate. In certain aspects, the SCP has a thickness (between the first and second electrodes) of between about 100 nm and about 1 μm, or between about 1 μm and about 0.05 mm, or between around 0.05 mm to about 2 mm or more (e.g., less than 1 cm, or less than 10 cm). In certain aspects, the first and second electrode layers each have a thickness of between about 10 nm and about 100 nm or greater (e.g., less than about 200 nm, or less than about 1000 nm, or less than about 1 μm, or less than about 1 mm, or less than about 1 cm), depending on the conductivity of the materials used. In certain aspects, the SCP is selected from the group consisting of a single-halide perovskite single crystal, a $MAPbBr_{3-x}Cl_x$ mixed-halide perovskite single crystal and a $MAPbI_{3-x}Br_x$ mixed-halide perovskite single crystal, where x may be an integer or fraction (e.g., decimal number) less than 3. In certain aspects, the SCP is a perovskite having a structure of $AMX_3$, wherein A is methylammonium ($CH_3NH_3^+$), $Cs^+$, formamidinum ($H_2NCHNH_2^+$) or a mixture thereof, M is a metal cation (e.g., $Pb^{2+}$, $Sn^{2+}$ or other dicovalent ions, or a mixture thereof), and X is a halide anion (e.g., $Cl^-$, $Br^-$, or $I^-$), thiocyanate ($SCN^-$) or mixture thereof. In certain aspects, the method further includes enhancing a defect density on or near a surface of the SCP proximal to the second electrode layer. In certain aspects, enhancing includes adding a thin layer of a material to the SCP prior to forming the second electrode layer, or chemically roughening the SCP surface or not washing the SCP after formation of the SCP prior to making the photodetector.

According to yet another embodiment, a photoelectronic device, such as a photodetector device, is provided that includes a first electrode, a second electrode, a semiconductor photoactive layer between the first electrode and the second electrode, and a charge quenching layer between the first electrode and the photoactive layer. In certain aspects, the semiconductor photoactive layer and the charge quenching layer comprise the same material, wherein the charge quenching layer has a higher density of charge quenching defects than the semiconductor photoactive layer. In certain aspects, the semiconductor photoactive layer and the charge quenching layer comprise different materials. In certain aspects, the charge quenching layer comprises a perovskite material and wherein the photoactive layer comprises a crystalline silicon. In certain aspects, the perovskite material comprises a single crystal perovskite. In certain aspects, the perovskite material comprises a non-crystalline perovskite. In certain aspects, the charge quenching layer comprises at least one of single crystal perovskite, polycrystalline perovskite, zinc oxide ($ZnO_x$), titanium oxide ($TiO_x$), tin oxide ($SnO_x$), zinc sulfide (ZnS), cadmium sulfide (CdS), lead sulfides (PbS), iron sulfide (FeS), iron pyrite ($FeS_2$), cadmium selenide (CdSe), lead selenide (PbSe), cadmium telluride (CdTe), lead telluride (PbTe), InAs, GaN, InSb, $Pb_{1-x}Sn_xTe$, $Hg_{1-x}Cd_xTe$, InAsSb, graphene quantum dots, carbon nanotubes, or fullerenes, and wherein the photoactive layer comprises at least one of single crystal perovskite, polycrystalline perovskite, Si, Ge, zinc oxide ($ZnO_x$), titanium oxide ($TiO_x$), tin oxide ($SnO_x$), zinc sulfide (ZnS), cadmium sulfide (CdS), lead sulfides (PbS), iron sulfide (FeS), iron pyrite ($FeS_2$), cadmium selenide (CdSe), lead selenide (PbSe), cadmium telluride (CdTe), lead telluride (PbTe), InAs, GaN, InSb, $Pb_{1-x}Sn_xTe$, $Hg_{1-x}Cd_xTe$, InAsSb.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE SEVERAL VIEWS OF THE DRAWING(S)

FIGS. 1A-1D illustrate properties of hybrid perovskite single crystals according to various embodiments.

Figure 6:
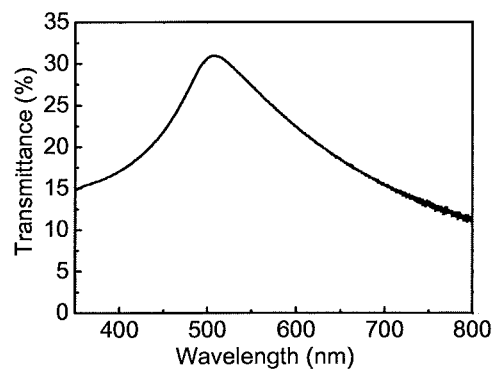

FIG. 6 shows the transmittance spectrum of 25 nm thick Au; the transparency of 25 nm thick Au was obtained by measuring the transmittance spectrum of 25 nm Au evaporated on the glass substrate. Although the Au electrode on glass can have different transmittance from that on OTP single crystals due to the much rougher single crystal surface as well as different refractive index contrasts of Au/OTP and Au/glass interface, the measured transmittance spectrum can still be considered as a fair approximation to the actual Au electrode transparency.

Figure 7A:
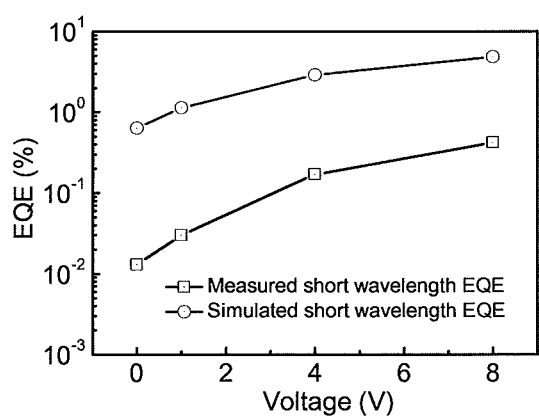
Figure 7B:
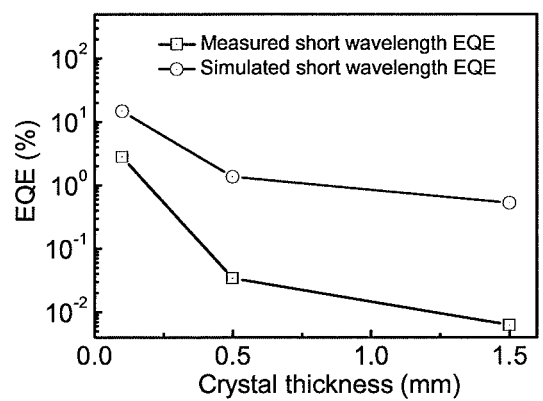

FIGS. 7A-7B show a comparison of measured and simulated EQE values under above band gap excitations with different voltage bias and crystal thickness.

Figure 8A:
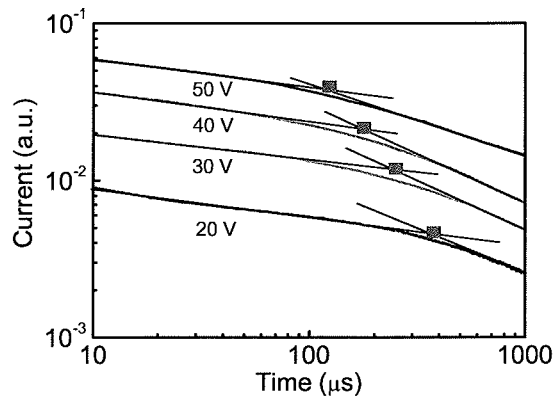
Figure 8B:
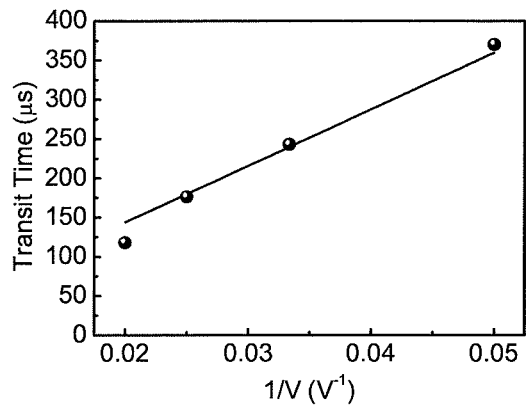

FIG. 8A shows a Time of Flight (ToF) measurement result of a $MAPbBr_3$ single crystal under different bias and FIG. 8B shows charge transit time as a function of the reciprocal of the bias.

Figure 9A:
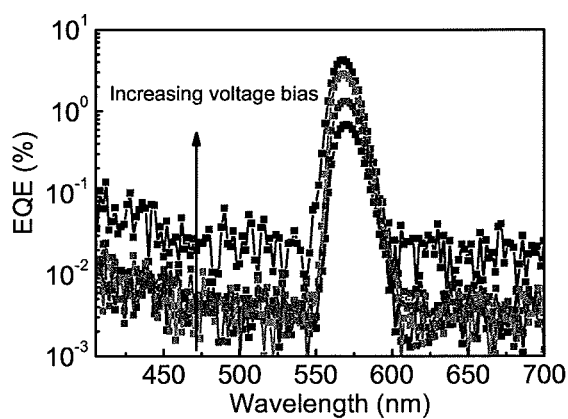
Figure 9B:
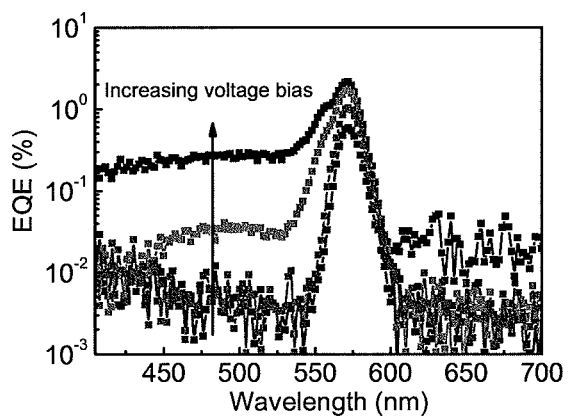

FIGS. 9A-9B show EQE spectra of $MAPbBr_3$ single crystals without and with washing under increased voltage bias of 0 V, −1 V, −4 V and −8 V.

Figure 10:
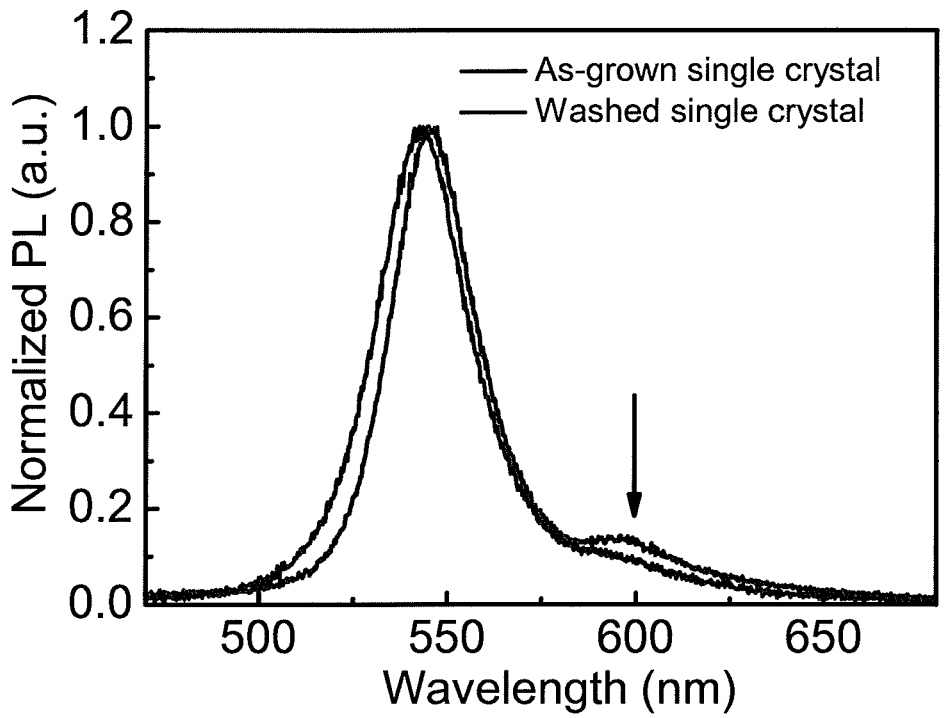

FIG. 10 shows PL spectra of a $MAPbI_xBr_{3-x}$ single crystal (the ratio of Br:I is 15:1) before (blue line) and after (red line) washing. The arrow points to the suppressed longer wavelength emission after crystal washing.

Figure 11:
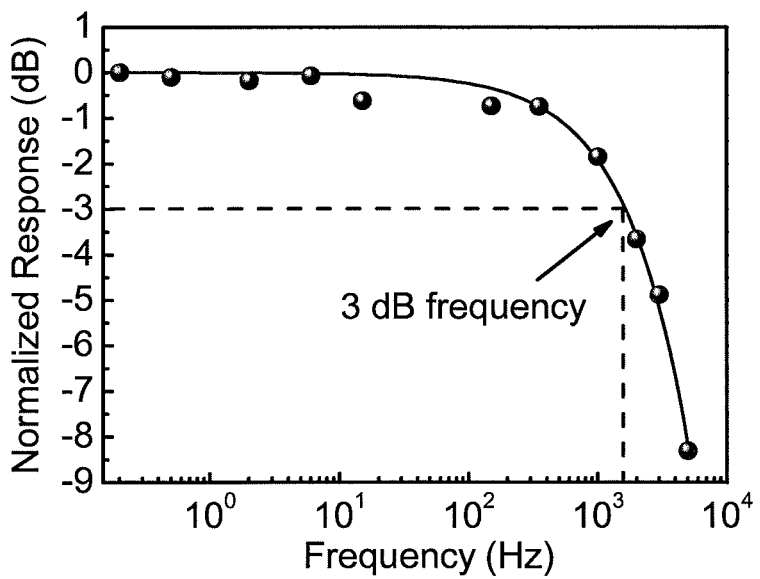

FIG. 11 shows normalized response as a function of the input signal frequency showing the 3 dB cutoff frequency is around 1600 Hz for a 0.9 mm thick MAPbBr3 single crystal. The solid line is drawn to guide the eye.

Figure 12A:
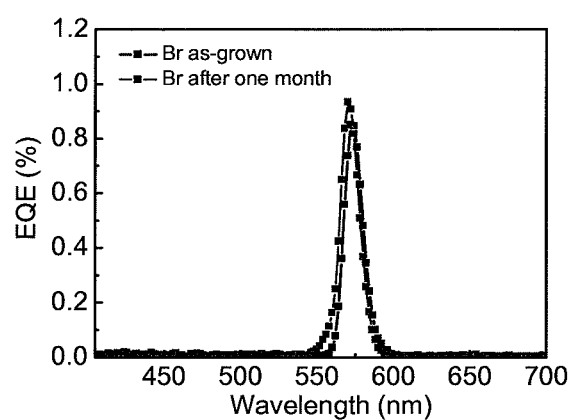
Figure 12B:
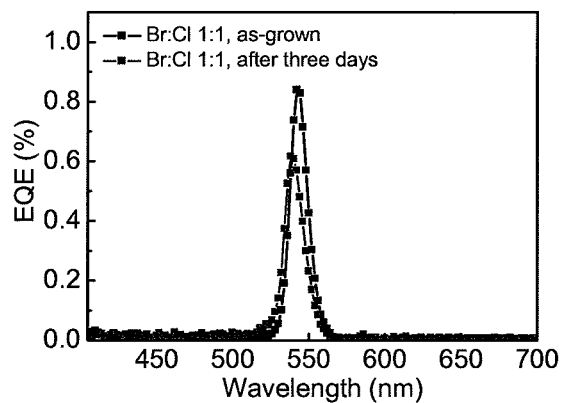

FIGS. 12A-12B shows EQE spectra of (a) an as-grown $MAPbBr_3$ single crystal and the same crystal after one month storage in air, and (b) an as-grown $MAPbBr_xCl_{3-x}$ (Cl/Br precursor ratio: 1:1) single crystal and the same crystal after three days storage in air, which demonstrate the good air stability of the single crystal devices.

Figure 13:
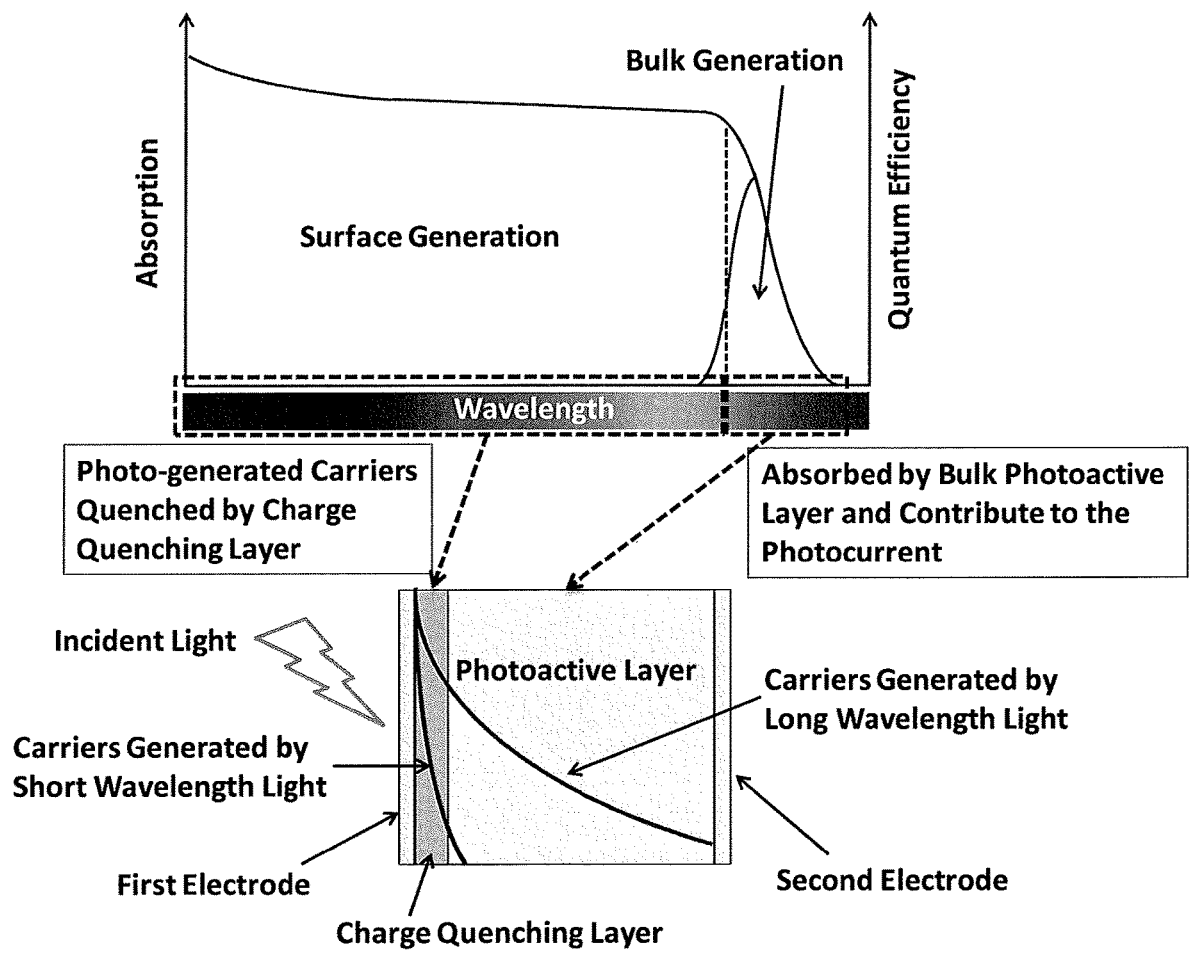

FIG. 13 shows a narrow band photoelectronic device structure and working mechanism according to an embodiment.

FIGS. 14A-14D show color map of calculated EQE as a function of quenching layer thickness and absorption coefficient when quenching rate is 1; normalized EQE-$\alpha$ curves with different quenching layer thicknesses; color map of calculated EQE as a function of quenching layer thickness and absorption coefficient when the quenching layer thickness is 9 μm; normalized EQE-$\alpha$ curves with different quenching rates.

Figure 15:
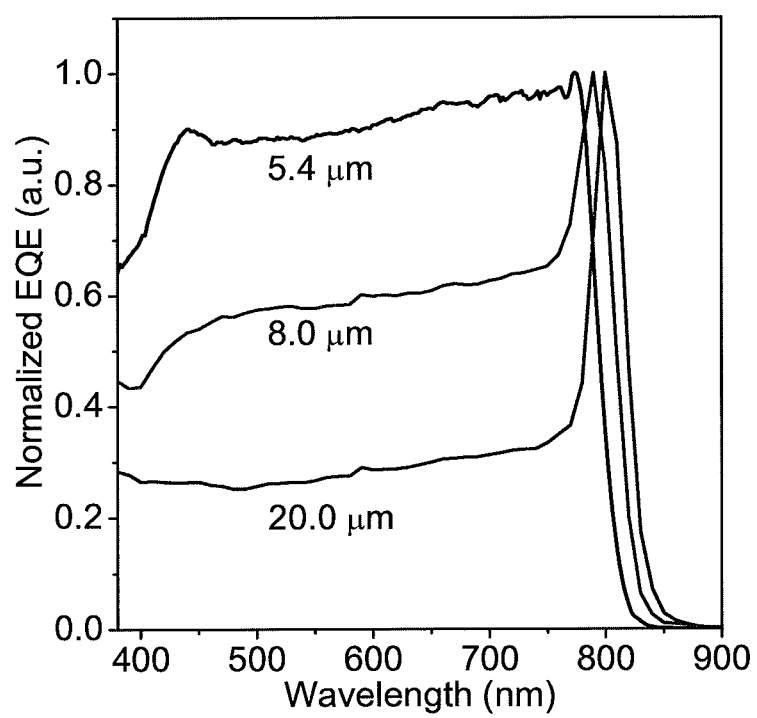

FIG. 15 shows normalized EQE spectra of perovskite polycrystalline thin film photodetectors with various thicknesses demonstrating that thin films, e.g., as thin as 8-20 μm, also show the narrow band spectral response.

DETAILED DESCRIPTION

The present disclosure provides narrow band photodetection devices using hybrid perovskite single crystals or polycrystalline perovskite (PCP) films. The response spectrum of the perovskite single crystal or PCP film can be advantageously specified within the visible frequency range by controlling or changing the halide composition in the perovskite material. Based on a comparison of the device modeling results and measured EQE spectra, it is concluded that the surface charge recombination induced suppression of charge collection for short wavelength excitation causes the narrow band photodetection. The devices advantageously show an ultra-narrow EQE peak with FWHM of less than about 20 nm, a high sensitivity with the detection limit down to about 80 pW/cm², and a high off resonance rejection ratio of less than about 200. The fabrication simplicity and lower-cost of hybrid perovskite materials for applications such single wavelength imaging, etc. is quite advantageous. Device performance can be further improved when a gain mechanism is introduced to increase the device responsivity, and the noise is suppressed by buffer layer engineering, thereby increasing the sensitivity of perovskite photodetectors. In addition, the resolution of the device or the FWHM of the response spectrum, which is already very good, can be further narrowed by optimizing the quality of single crystals to reduce the Urbach tail width. Additionally, a higher off resonance rejection ratio is achieved if more trap states (like $Pb^{2+}$ clusters) are introduced on the single crystal surface to increase the surface recombination rate so as to further quenching of the short wavelength response. The novel design paradigm presented by the various embodiments provides an alternative approach to realize the optical filter free UV, visible, or IR narrow-band photodetection, and it is not limited to any specific material system.

Growth and Properties of Hybrid Perovskite Single Crystals and PCP Films

Single-halide and mixed-halide perovskite single crystals were grown by the method proposed by Knop et al. (Knop, O., Wasylishen, R. E., White, M. A., Cameron, T. S. & Oort, M. J. M. V. Alkylammonium lead halides. Part 2. CH3NH3PbX3 (X=Cl, Br, I) perovskites: cuboctahedral halide cages with isotropic cation reorientation. *Can. J. Chem.* 68, 412-422 (1990).) with some modification. The precursor solution was prepared by mixing methylamine, single or mixed haloid acid with different halide ratios, and lead(II) acetate together to form a super saturated aqueous solution at 100° C., and the single crystals were precipitated from the precursor solution with gradually lowered temperature. Single crystals with a thickness of 0.5-5 mm can be readily synthesized. Photos of the single-halide and mixed-halide perovskite single crystals with varied Cl/Br and Br/I precursor ratios are shown in FIG. 1A. For the $MAPbBr_{3-x}Cl_x$ single crystals, the color gradually changed from transparent to yellow, and finally to orange with the increase of the Br/(Cl+Br) molar ratio from 0 to 1 in the precursor solution. And for the $MAPbI_{3-x}Br_x$ single crystals, the color gradually changed from orange to red with the increase of the I/(I+Br) molar ratio. The corresponding absorption spectra of these single crystals are shown in FIG. 1B, which shows gradually red-shifted absorption edge with the increase of Br/Cl or I/Br ratios, matching well with their color change.

Exemplary PCP films were fabricated on top of a substrate inside a $N_2$ atmosphere by a doctor blade coating process. A precursor solution was dropped onto the substrate, and swiped linearly by a glass blade, e.g., at a high speed of 0.75 cm s$^{-1}$. The substrates were held at elevated temperature during blade deposition (typically 125° C.). The thickness of the perovskite films during blade coating was controlled by perovskite precursor solution concentration and the depth of the blading channel. Methylammonium iodide ($CH_3NH_3I$) and lead (II) iodide ($PbI_2$) dissolved in dimethylformamide (DMF) were used as the perovskite precursor solution. A 1:1 molar ratio between lead (II) halide and methylammonium halide was used. The as-deposited PCP films were subsequently thermally annealed, e.g., at 100° C. for 60 minutes. It should be appreciated that other methods of perovskite crystal or film formation, such as printing or slot-die formation processes, may be used without departing from the scope of this disclosure.

The photoluminescence (PL) spectra of the single crystals at room temperature displayed in FIG. 1B show red shifted peak with the same trend as their absorption edge shift. It is noted that each PL spectrum has two peaks. The shorter wavelength PL peak can be ascribed to the band gap emission, while the shoulder peak at the longer wavelength may be from surface contamination or decomposition related product induced trap state emission, which is supported by suppression of this peak after crystal washing (see the discussion below). To verify the actual halide composition in the crystals, the powder X-ray diffraction (XRD) measurement was also carried out on the $MAPbBr_{3-x}Cl_x$ crystals, and the XRD spectra are shown in FIG. 1C. The diffraction peaks shifted to lower angle with the increase of the Br precursor ratio, indicating increased lattice constant after incorporating Br with larger atomic radius. By calculating the (002) peak shift using Vegard's law, the actual Cl/(Cl+Br) molar ratio in the $MAPbBr_{3-x}Cl_x$ single crystals with the nominal Cl/(Cl+Br) ratio of 50.0% and 80.0% in the precursor solution is calculated to be 17.7% and 61.7%, respectively. Therefore, the actual Br/Cl ratio in the $MAPbBr_{3-x}Cl_x$ single crystals is higher than that in the precursor, inferring the preferential incorporation of Br compared to Cl in the $MAPbBr_{3-x}Cl_x$. The band gap of the mixed-halide single crystals obtained from the shorter wavelength PL emission peak and the Cl/(Cl+Br) ratio can be fitted with the empirical expression:

$$E_g[MAPb(Cl_xBr_{1-x})_3] = E_g[MAPbBr_3] + (E_g[MAPbCl_3] - E_g[MAPbBr_3] - b)x + bx^2, \quad (1)$$

where $E_g$ is the band gap, and b is the bowing parameter. This yields a bowing parameter of 0.088 eV (FIG. 1D). For the $MAPbI_{3-x}Br_x$ single crystals, however, the actual Br/I ratio cannot be directly obtained from the XRD peak shift or the band gap change, because Vegard's law becomes invalid for solid solution with two components of different crystal structures. Nevertheless, the red shifted absorption edge and the PL peak position definitely indicate the increased I molar ratio in the $MAPbI_{3-x}Br_x$ single crystals with increasing the I/Br ratio in the precursor.

Figure 2A:
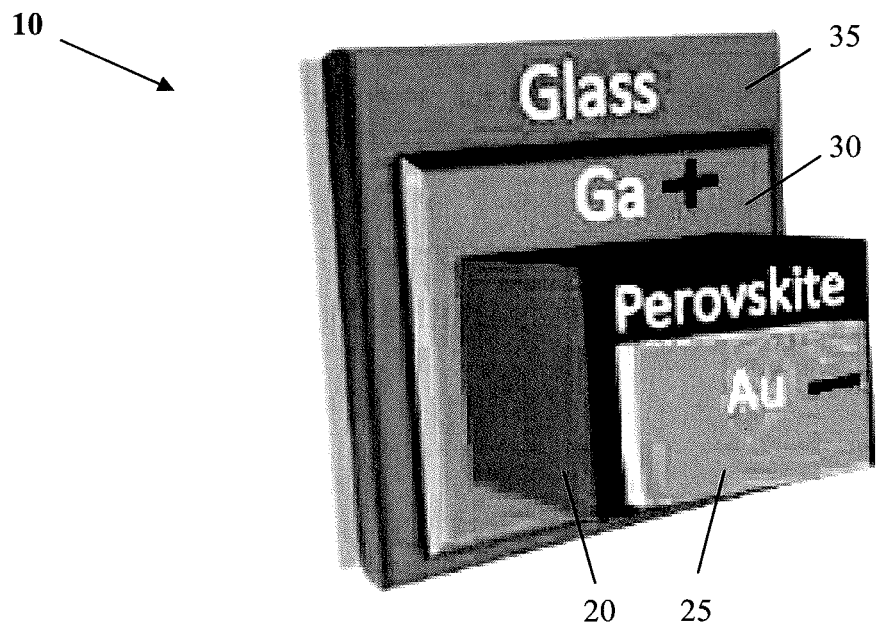
FIGS. 2A-2B illustrate a device structure according to an embodiment, and narrow band photodetection results according to various embodiments.

Narrow-Band Photodetectors Based on Single-Halide and Mixed-Halide Perovskite Single Crystals In one embodiment, a single crystal photodetector is fabricated using an as-grown single-halide or mixed-halide perovskite single crystal as disclosed herein. A schematic of a device structure according to an embodiment is shown in FIG. 2A. Photodetector device 10 includes a perovskite single crystal 20 having two electrodes (anode 25 and a cathode 30) on opposite sides thereof. A substrate 35 may be used to assist with fabrication of the device and/or for structural robustness of device 10, but is not necessary for operation of device 10. In one embodiment, anode 25 includes a thin layer of a transparent or semi-transparent conductive material (e.g., 25 nm Au layer). Useful anode materials include any transparent or semi-transparent conductive or semi-conductive material, such as metals or metal films, conductive polymers, carbon nanotubes, graphene, a network of metal nanowires, organic or inorganic transparent conducting films (TCFs), transparent conducting oxides (TCOs), etc. Specific examples of anode materials include gold (Au), silver (Ag), titanium (Ti), indium tin oxide (ITO), copper (Cu), carbon nanotubes, graphene, aluminum (Al), chromium (Cr), lead (Pb), platinum (Pt), and PEDOT:PSS. The dimensions of the anode layer 25 may be varied depending on the material used. For example, the anode 25 may have a thickness of between about 10 nm and about 100 nm or 100 nm or greater (e.g., less than about 200 nm, or less than about 1000 nm), depending on the properties of the materials used, such as the transparency and the conductivity. Known deposition or thermal evaporation techniques may be used to form the anode layer 25 on the single crystal 20. Cathode 30 also includes a thin layer of conductive or semi-conductive material. Useful cathode materials include the same materials as may be used for the anode, although the cathode need not be transparent. Specific examples of cathode materials include gallium (Ga), gold (Au), silver (Ag), tin titanium (Ti), indium tin oxide (ITO), indium (In), copper (Cu), carbon nanotubes, graphene, aluminum (Al), chromium (Cr), lead (Pb), platinum (Pt), and PEDOT:PSS. The dimensions of the cathode layer 30 may be varied depending on the material used. For example, the cathode 30 may have a thickness of between about 10 nm and about 100 nm or 100 nm or greater (e.g., less than about 200 nm, or less than about 1000 nm, or less than about 1 µm, or less than about 1 mm, or less than about 1 cm), depending on the conductivity of the materials used. The cathode layer 30 may be formed on the substrate 35 and then attached to the crystal 20, or the cathode layer may be formed on the crystal 30. Known deposition or thermal evaporation techniques may be used to form the cathode layer 30. The substrate 35 provides structural stability and may include glass, polymer, semiconductor materials, etc.

The thickness of the single crystal for the devices may vary depending on the application, for example, the thickness may be between about 100 nm and about 1 or between about 1 µm and about 0.05 mm, or between around 0.05 mm to about 2 mm or more (e.g., less than 1 cm, or less than 10 cm). In one embodiment the crystal is on the order of about 1 mm thick. The device 10 in one embodiment operates under reverse bias, e.g., between 0 and about −4V. When light illuminates the anode 25, the photo-generated electrons and holes in the region of the crystal 20 close to the anode 25 will drift across the single crystal under the applied electric field, with the electrons drifting towards the cathode 30 and the holes drifting to the anode, and are collected by both electrodes to generate the output photocurrent. Leads or connectors (not shown) are provided to connect the device electrodes to desired circuit elements, e.g., for processing of the photocurrent signals to ultimately provide a useable or viewable output.

The thickness of the active layer may vary depending on the charge-quenching rate and carrier mobility in the surface region or charge quenching region, as well as the absorption coefficient in the main active region. Generally, the larger the charge quenching rate and the smaller the mobility in the quenching region, the thinner the main active region may be.

Figure 2B:
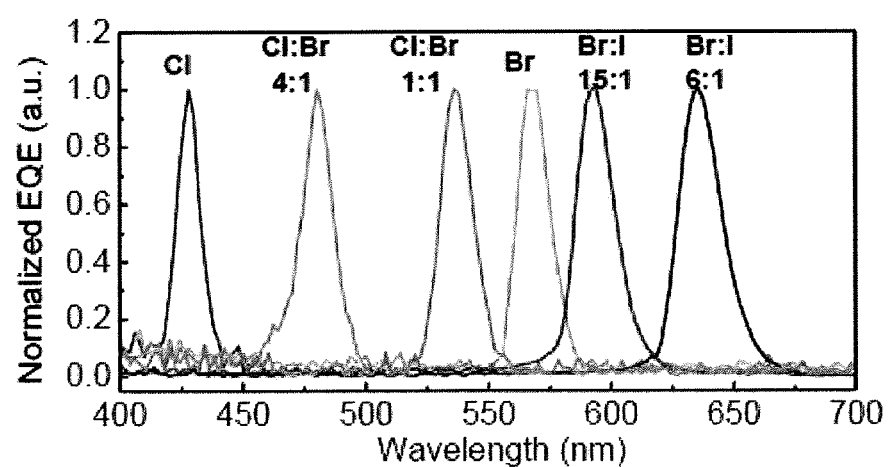

FIG. 2B shows the normalized EQE spectra of devices with single crystals of different halide compositions under the bias of −1 V according to various embodiments. Interestingly, it is found that the EQE spectra of all the devices only exhibit a single narrow peak close to the absorption edge of each kind of single crystal, in strong contrast to the wide spectra observed in thin film perovskite photodetectors. The FWHM of all these photodetectors are less than about 20 nm, enabling narrow band photodetection. The maximum EQE values are between 0.2% to 1.6%, limited by the low transparency 20%) of 25 nm Au electrode used as well as the low bias applied. The response spectra were tuned to cover the whole visible spectral range by simply changing the band gap of the organolead trihalide perovskite (OTP) single crystals. Compared to the narrow EQE peak of organic photodiodes with a thick junction, the EQE peak of the OTP single crystal photodetectors are more than five times narrower. The narrow spectral response is advantageous for use in many applications where a specific wavelength needs to be detected while the background emission should be suppressed, such as flame detection to detect the existence of a specific kind of chemical element, the detection of emissions from fluorescent dyes (e.g., biomarkers) of different colors in biomedical applications, selected-wavelength imaging, etc.

Surface Charge Recombination Induced Narrow Band Photodetection

Figure 3A:
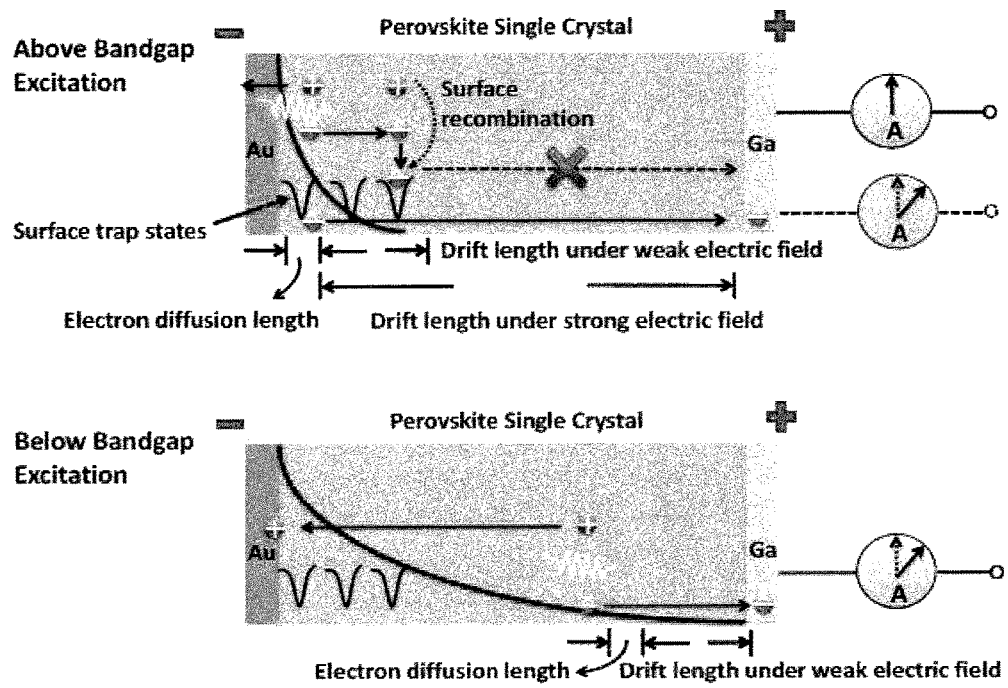
FIGS. 3A-3F illustrate a narrow band photodetection model and mechanism study.

The multiple surface related phenomena observed in the single crystals, including shifted PL emissions and quick charge recombination allocated to the crystal surface, and varied EQE spectrum shapes with different surface treatments, can be explained by the surface charge recombination causing the narrow spectral photoresponse. High density of surface charge traps have been observed in OTP thin films, which explains the photocurrent hysteresis in perovskite solar cells and large photoconductive gain in the perovskite photodetectors. The single crystals synthesized from the super-saturated solution is unlikely to be free of surface defects, because taking the crystals out of the precursor solution may cause partial decomposition of the surface or contamination by precursors, e.g., attaching of nonstoichiometric precursors. The surface-charge-recombination-enabled narrow-band photodetection mechanism is illustrated by the schematic drawing shown in FIG. 3A. For the above band gap excitation, the light penetrating depth is very small (e.g., less than 300 nm) due to very large absorption coefficient of the hybrid perovskite materials, therefore the charge carriers are generated mostly in a narrow region near the electrode. Due to the severe surface charge recombination, the charges generated by above bandgap photo-excitation can be easily quenched. In addition, photogenerated charges not far away from the crystal surface can diffuse quickly to these surface charge sinks due to the large carrier mobility in these single crystals. Therefore the short wavelength EQE is suppressed due to the surface charge recombination. While for the below bandgap photo-excitation (absorption), light penetrates much deeper into the crystal due to the much smaller absorption coefficient. These photogenerated charges are less susceptible to the surface recombination, because the applied field drives them toward the electrode before they are able to diffuse to the anode/perovskite interface, which results in a higher charge collection efficiency. Therefore, the EQE at the longer wavelength range is much larger than that at the shorter wavelength range, which results in the narrow band EQE spectra.

Figure 3B:
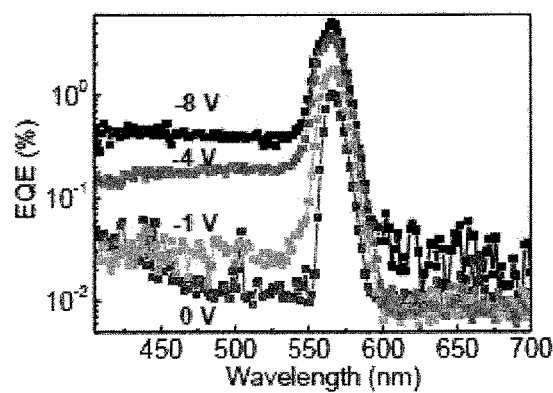
Figure 3C:
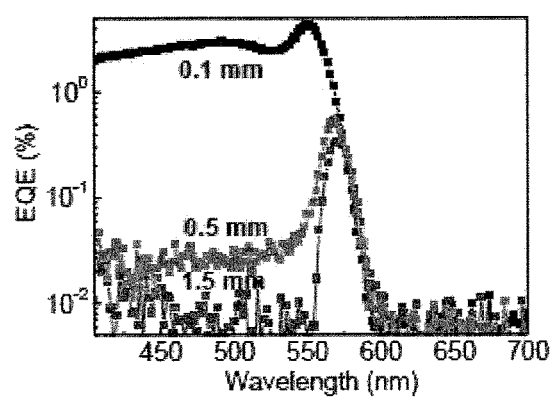

To verify this mechanism, MAPbBr$_3$ single crystal devices were used to study the crystal thickness and field dependent EQE spectra. The field dependent EQE spectra of a 0.3 mm thick MAPbBr$_3$ single crystal device are shown in FIG. 3B. The EQE curve at zero bias showed a narrow peak. EQEs increased with the applied bias due to the enhanced charge extraction efficiency, but the EQEs at the short wavelength range increased much more rapidly than in the long wavelength range. This device lost the narrow band detection capability under a reverse bias larger than −4 V. This can be well explained by the fact that a larger applied electric field pushed the photogenerated charges quickly away from the surface so that even photogenerated charges by short wavelength light could contribute to the photocurrent. The MAPbBr$_3$ single crystal thickness was also decreased from 1.5 mm to 0.5 mm and 0.1 mm, and the EQE spectra under a fixed bias of −4 V was studied. The thinner MAPbBr$_3$ single crystals were obtained by carefully cleaving the same 1.5 mm thick single crystal so that the same crystal was studied to avoid variation of electronic properties among different single crystals. As shown in FIG. 3C, with the decreased single crystal thickness, the photoresponse in the short wavelength range began to show up, and finally approached the peak value near the bandgap. This variation trend can again be explained by the presence of a larger electric field in the thinner devices for the fixed bias applied. Therefore the applied electric field should not be too large to achieve the desired narrow band photodetection.

Figure 3D:
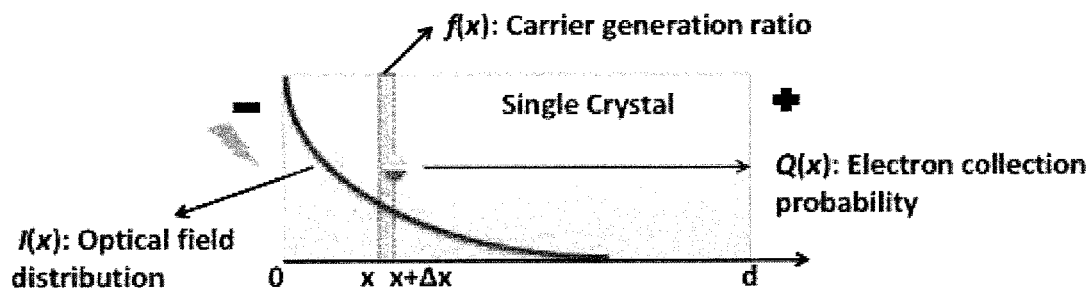

To quantitatively explain the EQE spectrum shape change under different bias, the charge collection efficiency in the single crystal devices was modeled to simulate the field and crystal thickness dependent EQE at different excitation light wavelengths. As shown in FIG. 3D, the charge collection ratio Q(x) of the charges photogenerated at position x can be described by the Hecht equation which has been broadly applied in radiation semiconductor devices:

$$Q(x) = \frac{L_d}{d-x}\left(1 - e^{-\frac{d-x}{L_d}}\right) \quad (2)$$

$$L_d = \sqrt{\frac{k_B T}{q}\mu\tau + \mu\tau\frac{V}{d}}, \quad (3)$$

where $L_d$ is the sum of the charge diffusion length and drift length, $k_B$ is the Boltzmann constant, T is the temperature, q is the elementary charge, µ is the carrier mobility, τ is carrier bulk recombination lifetime, d is the crystal thickness, and V is the applied bias. The total charge collection ratio or the device IQE, is derived by integrating Q(x):

$$Q = \int_0^d f(x)Q(x)dx, \quad (4)$$

where f(x) is the ratio of the carriers generated at position x to the incident photon number. The calculated charge collection efficiency is shown in FIGS. 5A-5H for crystals with a thickness of 1.5, 0.5, 0.3, and 0.1 mm for above-bandgap (e.g., 470 nm) and below-bandgap absorption (e.g., 552~572 nm, depending on the peak EQE wavelength of each device). The carrier diffusion length of the MAPbBr$_3$ single crystal measured from the steady photocurrent method is about 7 µm, giving a µτ product of $1.9 \times 10^{-9}$ m$^2$/V. The EQE was derived by multiplying the transparency of gold (Au) (see, FIG. 6) with the calculated IQE at each wavelength. The calculated EQEs are shown in the FIG. 3E, FIG. 3F, FIG. 7A, and FIG. 7B at different crystal thickness and applied bias. In both cases, the simulated EQEs agree well with the experiment data for below-bandgap photo-excitation, while there is a large discrepancy for the above-bandgap photo-excitation. This indicates the accurate simulation of above-bandgap EQE must take into account the surface charge recombination because of the much shorter light penetration length.

Figure 3E:
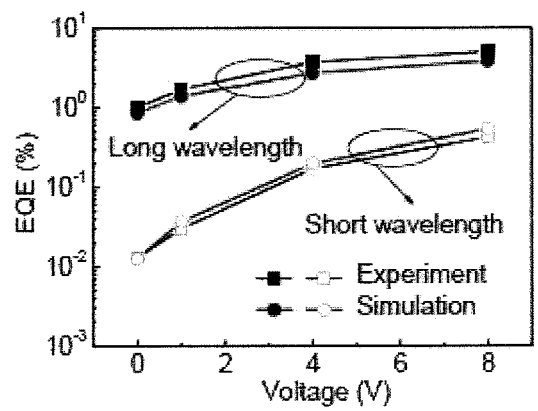
Figure 3F:
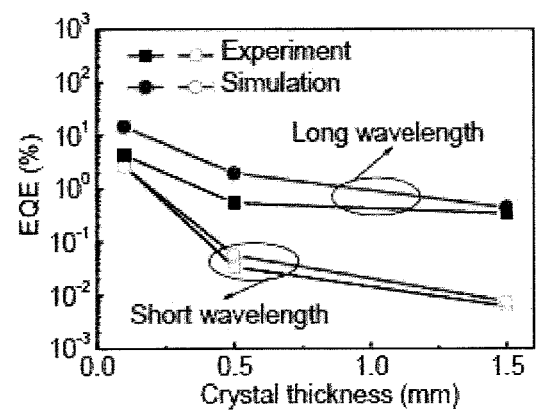

The surface recombination velocity of the MAPbBr$_3$ single crystal was derived from the photoconductivity with the modified Hecht equation:

$$I(V) = \frac{I_0 \mu\tau\frac{V}{d}\left(1 - e^{-\frac{d}{\mu\tau V}}\right)}{d\left(1 + \frac{ds}{\mu V}\right)}, \quad (5)$$

where $I_0$ is the saturation value of photocurrent, and s is the surface recombination velocity. In the photoconductivity measurement, short wavelength (e.g., 470 nm) light was used in order to ensure that the carriers were generated close to the surface of the crystal. The photoconductivity curve can be well fitted by the modified Hecht equation, yielding a s/µ of $2.5 \times 10^5$ V/m and µτ product of $1.4 \times 10^{-9}$ m$^2$/V,[41] which is very close to that derived from the steady photocurrent method. Based on the carrier drift mobility derived from the Time-of-Flight method (see, FIGS. 8A-8B), s is calculated to be 5800 cm/s which is very high compared to that of the passivated Si wafers (<100 cm/s) for high efficiency solar cells. This confirms the severe recombination at the surface of the MAPbBr$_3$ single crystals. The simulated EQE for above-bandgap excitation was then corrected (EQE$_c$) by considering the competition between the surface recombination velocity and carrier escaping velocity from the surface:

$$EQE_c = EQE \times \frac{v_e}{s + v_e}, \quad (6)$$

where $v_e$ includes both drift velocity (µE) and diffusion velocity ($L_{diff}/\tau$, where $L_{diff}$ is the carrier diffusion length) because both of them contribute to excess carriers leaving the surface. After applying the correction to the above-bandgap excitation EQE, the simulated EQE$_c$s match excellently with the experiment data for the devices at different bias and with different crystal thickness, as shown in FIGS. 3E and 3F. This quantitative coincidence confirms that the surface charge recombination is the origin for the narrow band response of the perovskite single crystal photodetectors. In FIG. 8A and FIG. 8B, The solid line is a linear fitting to the data to extract the electron mobility, which is about 2.3 cm$^2$/Vs. The ToF measurement was conducted by illuminating the device with 337 nm pulse laser (SRS NL 100 Nitrogen laser, pulse width: 4 ns) from the semitransparent Au electrode under different reverse bias. The generated weak photocurrent was transformed to voltage signal by a 2 kΩ resistor, and recorded using an Agilent 1 GHz digital oscilloscope (Agilent DSO-X 3104A). The electron mobility was calculated from the equation:

$$\mu = \frac{d^2}{\tau_t V}$$

where d is thickness of the single crystal, V is the applied bias, and $\tau_t$ is the transit time of the charge carriers. Due to the dispersive transport property of carriers in the single crystal, the charge transit time was determined from the intercept of the pre-transit and post-transit asymptotes of the photocurrent on a double-logarithmic scale plot.

To demonstrate the effect of surface charge recombination on the narrow band photoresponse, the influence of crystal surface cleaning on the EQE spectra of the devices was tested. Two MAPbBr$_3$ single crystals of comparable thickness were used, with one crystal ultrasonically washed in diethyl ether three times, and the other without any washing after being taken out of the precursor solution. Since there may be a lot of contaminants adhering to the surface of the crystals when the crystals were taken out of the solution, these nonstoichiometric contaminates will behave as surface charge recombination centers to quench the photogenerated charge carriers near the crystal surface. After thorough crystal washing, these contaminants can be removed partially, leading to much less severe surface charge recombination. As expected, the short wavelength EQEs of the washed crystal were much higher than those of the unwashed crystal at high bias (see, FIG. 9), which confirms that the suppression of EQE at short wavelength is highly dependent on the crystal surface properties. To further confirm the effect of surface cleaning by washing, PL was measured on the same $MAPbI_xBr_{3-x}$ single crystal synthesized with the Br:I ratio of 15:1 before and after washing. As shown in FIG. 10, the PL shoulder peak at the longer wavelength, which was assigned to emission from surface contamination or decomposition related product, was suppressed after washing the crystal. This verifies the reduction of the defect density on the crystal surfaces after washing, and the surface defects are responsible for the surface charge recombination and hence the narrow band photoresponse.

According to an embodiment, the surface charge recombination rate of device 10 is optimized by maintaining (e.g., not washing or rinsing the crystal) or enhancing the defect density on or near the surface of the crystal. In one embodiment, a chemical agent (e.g., chemical contaminant) may be used to enhance the surface defect density. For example, contaminants may be added to the surface, e.g., a thin layer of a material with defects may be deposited on the photoactive material, e.g., crystal, between the photoactive material and the anode. Such a material might include a thin layer of a perovskite single crystal or non-crystalline perovskite, or a semiconductor material or other transparent or semi-transparent material that contributes to the defect density. For example such material might include non-stoichiometric perovskite materials, a mechanically damaged crystal surface, an etched crystal surface, ZnO nanoparticles, PbS quantum dots, CdTe nanoparticles, $TiO_2$ nanoparticles, $SnO_2$ nanoparticles, etc.

In certain embodiments a narrow band photoelectronic device, such as a photodetector device, includes a structure as shown in FIG. 13. The narrow band photodetector structure and its working mechanism includes a first electrode, a second electrode, a semiconductor photoactive material between the first electrode and the second electrode, and a charge quenching region between the first electrode and the photoactive layer. The charge quenching region may be a different material deposited on or attached to the photoactive material, or it may be a surface region of the photoactive material, e.g., with an enhanced defect density relative to the photoactive region. When light impinging from the transparent first electrode, due to the large light absorption coefficient of short wavelength light and hence its very small penetration depth in the photoactive layer, the photo-generated excess charge carriers will be quenched by the charge quenching layer, which contains a high density of defects in order to enhance the recombination rate of charge carriers generated near the surface region. On the other hand, the bulk generated excess charge carriers excited by long wavelength light, owing to its penetration depth comparable to or larger than the photoactive layer thickness, will distribute relatively uniformly in the photoactive layer and be less susceptible to the surface charge recombination. In this manner the excess charge carriers are able to diffuse or drift to the second electrode and be collected, leading to a narrow-band light response spectrum with a small full-width-at-half-maximum (FWHM).

In certain embodiments, the charge quenching layer can have the same composition as the main photoactive layer. For example, another layer of the same material may be deposited or formed on the photoactive material, or a region of the photoactive material may be modified to have a higher defect density, such as a single crystal perovskite with a surface full of defects. The charge quenching layer may also have a different composition than the main photoactive layer. One example is the quenching layer can be a perovskite material with defects, and the photoactive layer can be crystalline silicon. Various examples of the photoactive materials include Si, perovskite materials, GaN, InGaAs, GaAs, AlGaN, Ge, P3HT:PCBM, and CdTe. Various examples of the charge quenching layer materials include a perovskite single crystal or non-crystalline perovskite, or a semiconductor material or other transparent or semi-transparent material that contributes to the defect density, e.g., non-stoichiometric perovskite materials, a mechanically damaged crystal surface, an etched crystal surface, ZnO nanoparticles, PbS quantum dots, CdTe nanoparticles, $TiO_2$ nanoparticles, $SnO_2$ nanoparticles, etc.

In certain embodiments, the materials may be single crystalline, but also may be non-crystalline. Even for single crystalline perovskites, different methods make different perovskite single crystals, e.g., having different frequency responses as discussed herein.

The responsiveness of the device, e.g., FWHM, may be less than 20 nm or greater than 20 nm (e.g., less than about 100 nm or less than about 200 nm, or less than about 1000 nm) depending on the properties of the materials used, such as absorption coefficient, mobility, carrier lifetime, etc.

In certain embodiments, the various materials and dimensions for the various device components, such as electrodes and photoactive and charge quenching layers, as discussed above with regard to photodetector device 10 may be used.

The thickness of the active region or layer may vary depending on the charge-quenching rate and carrier mobility in the charge quenching region or layer, as well as the absorption coefficient in the main active region or layer. Generally, the larger the charge quenching rate and the smaller the mobility in the charge quenching layer, the thinner the main active layer may be. Here a model is proposed to simulate the effect of the charge quenching layer on the narrow band response of the photodetector, where it is assumed that the charge quenching layer has the same light absorption coefficient, mobility and resistivity as the active layer. The quenching layer thickness is k, and the active layer thickness is d. Both the quenching layer and active layer can absorb photons, generate charges, and contribute to the photocurrent. The only difference is that most of the charges generated in the quenching layer will be directly quenched without any further diffusion or drift due to the large surface recombination velocity of this layer. In the quenching layer, φ is defined as the ratio of quenched charges to the total charges generated in the charge quenching layer:

$$\varphi = \frac{s}{v_e + s} = \frac{s}{\frac{\mu V}{d} + \frac{L_{diff}}{\tau} + s}, \quad (7)$$

where s is charge recombination velocity, $v_e$ is the charges escaping velocity of the surface, and $L_{diff}$ is the charge diffusion length. The unquenched charges can still diffuse or drift away from the charge quenching layer. So the contribution of quenching layer to the total IQE is:

$$A = (1 - \varphi) \int_0^k \frac{1 - e^{(x-d-k/L_d)}}{d + k - x} L_d \alpha e^{-\alpha x} dx. \quad (8)$$

The contribution of active layer to the total IQE is:

$$B = \int_k^d \frac{1 - e^{(x-d-k)/L_d}}{d+k-x} L_d \alpha e^{-\alpha x} dx. \tag{9}$$

The total IQE is:

$$IQE = A + B. \tag{10}$$

Considering the transmittance T of the light incident electrode and the part of light absorbed by the active layer equals $(1-e^{-2\alpha(d+k)})$, the total EQE is:

$$EQE = T \times (1-e^{-2\alpha(d+k)}) \times IQE. \tag{11}$$

Figure 14A:
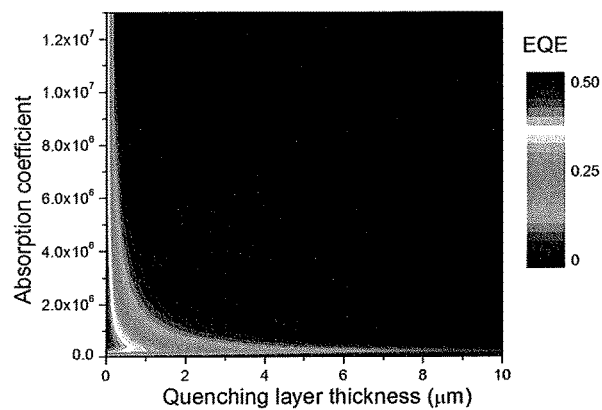
Figure 14B:
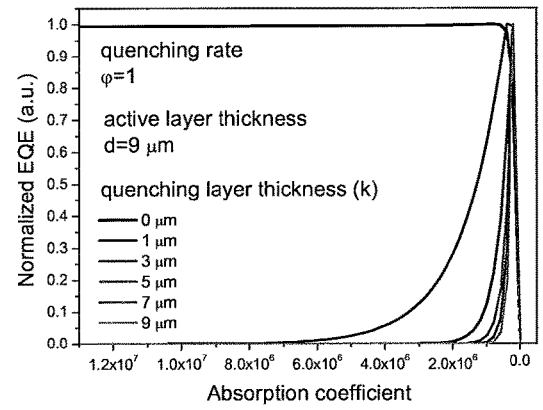
Figure 14C:
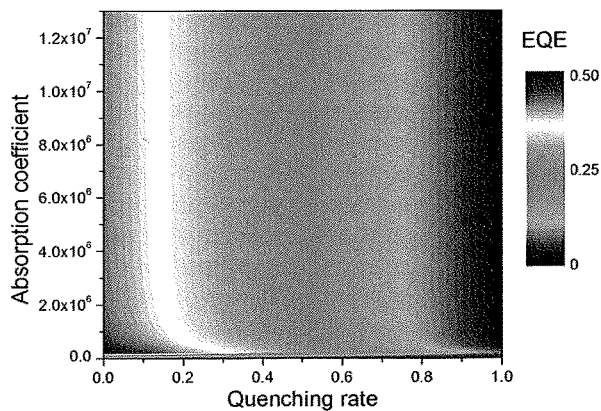
Figure 14D:
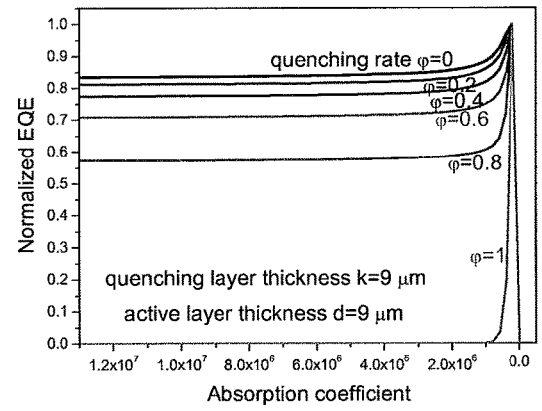

Assuming T is 0.5, the applied bias is 1 V, and the carrier mobility is 1 cm$^2$/Vs, the carrier lifetime is 78 ns. The absorption coefficient range is defined from $1.3 \times 10^7$ to zero (i.e. from above-bandgap-excitation to below-bandgap-excitation). If the quenching rate $\varphi=1$, and the active layer thickness d=9 μm, the EQE as a function of the absorption coefficient of incident light with different quenching layer thicknesses is shown in FIGS. 14A and 14B. It is shown that the EQE at an absorption coefficient higher than $2 \times 10^6$ can be suppressed by nearly 100%, after inserting the quenching layer, and increasing the quenching layer thickness can decrease the full-width at half-maximum (FWHM). If the active layer d=9 μm and the quenching layer thickness k=9 μm, the EQE as a function of the absorption coefficient of the incident light with different quenching rates are shown in FIGS. 14C and 14D. It is shown that the above-bandgap-excitation EQE is dramatically suppressed, when quenching rate is increased from 0 to 1. EQE peak also becomes narrower along with the increase of quenching rate.

The thickness of the active region or layer need not be as thick, and for example may be less than about 1 mm. FIG. 15 shows the normalized EQE spectra of devices with perovskite polycrystalline films of different thicknesses from 5.4-20 μm according to various embodiments. It is found that films as thin as 8-20 μm also show the narrow band spectral response, which is in agreement with the calculation result shown in FIG. 14 that the narrow band photodetector can be realized in perovskite thin film as long as the surface charge quenching ratio is sufficiently large. In general, the thickness of a polycrystalline perovskite film may range from about 100 nm to about 1 mm, according to certain embodiments.

Appendix A provides additional detail regarding the effect of the charge quenching layer on EQE.

Device Performance of Narrow Band Photodetectors

Figure 4A:
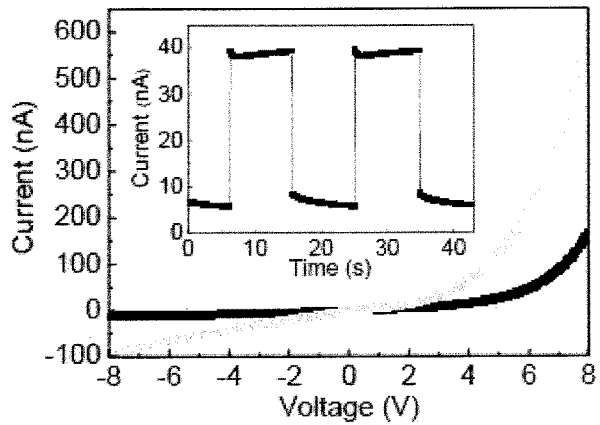
FIGS. 4A-4F illustrate device performance of narrow band photodetectors according to various embodiments.
Figure 4B:
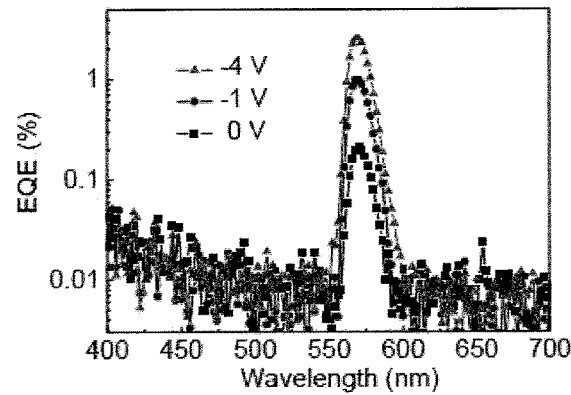
Figure 4C:
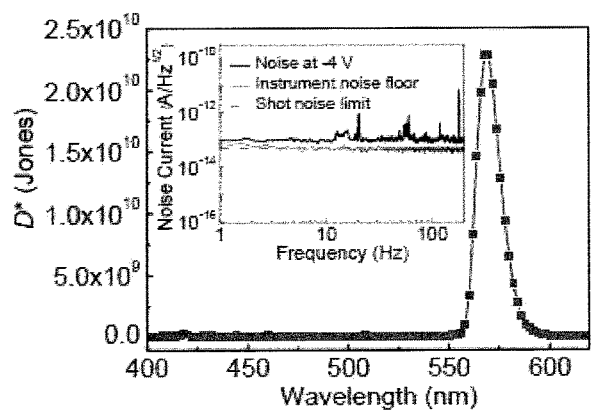
Figure 4D:
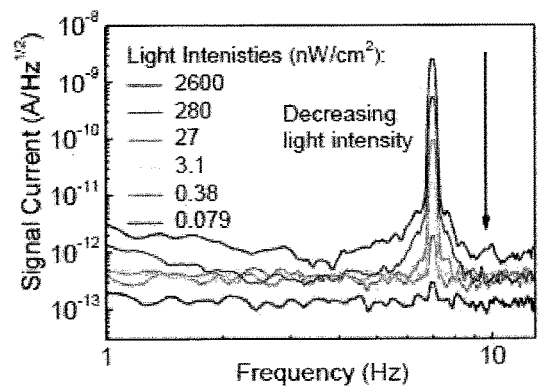
Figure 4E:
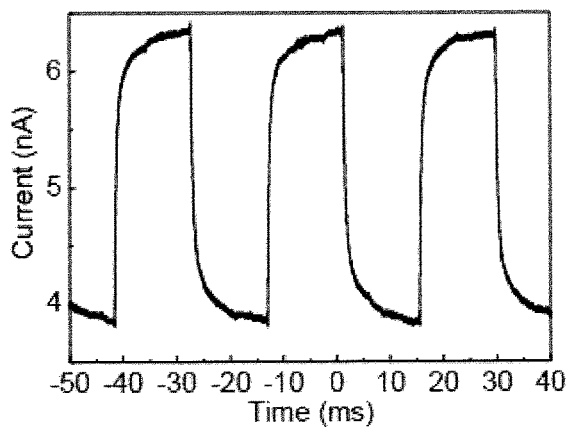
Figure 4F:
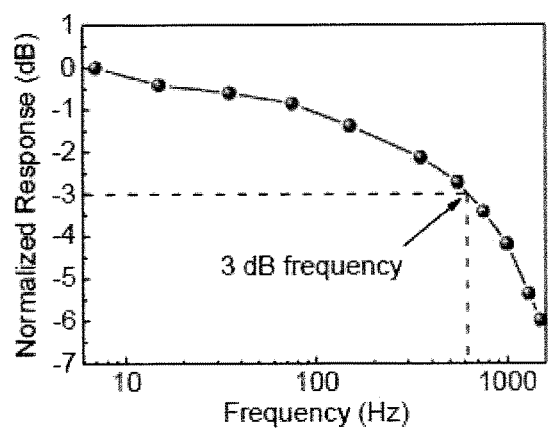
Figure 5A:
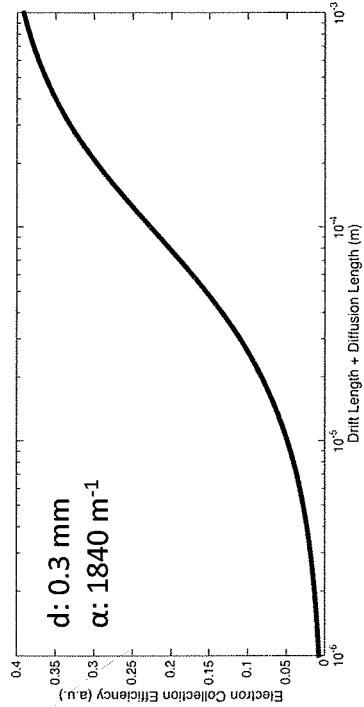
FIGS. 5A-5H show simulated electron collection efficiency as a function of the sum of carrier drift and diffusion length with different crystal thickness (d) and light absorption coefficient ($\alpha$).
Figure 5C:
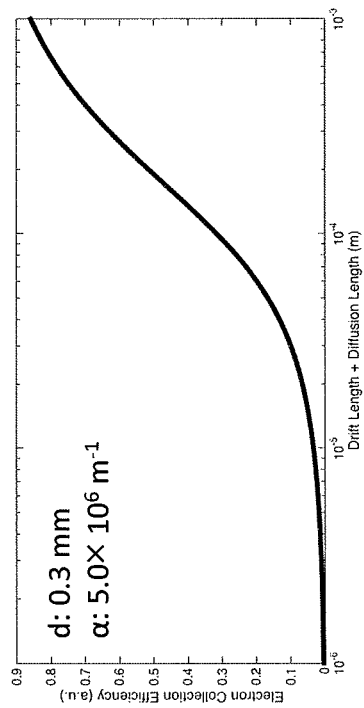
Figure 5B:
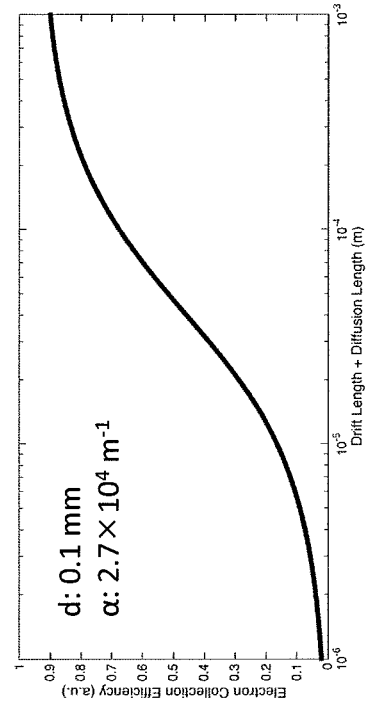
Figure 5D:
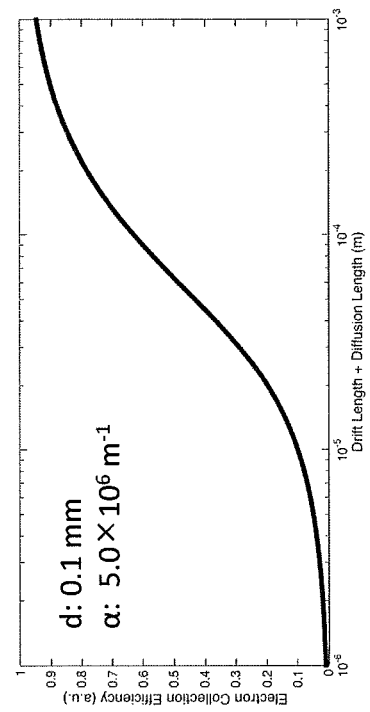
Figure 5E:
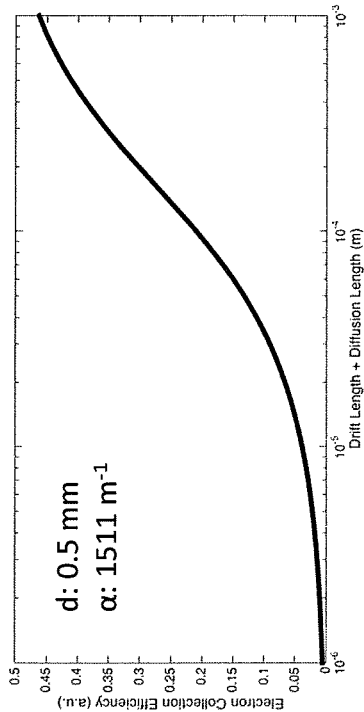
Figure 5G:
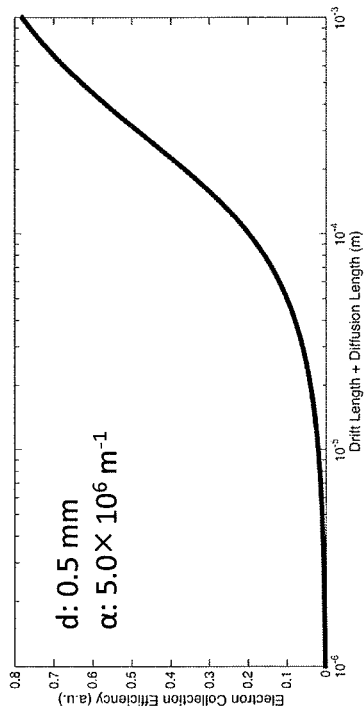
Figure 5F:
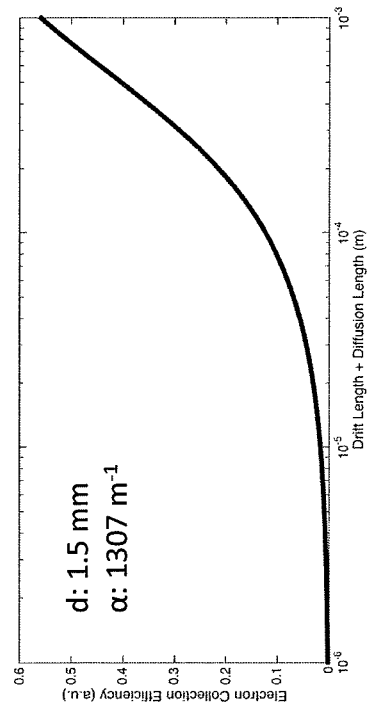
Figure 5H:
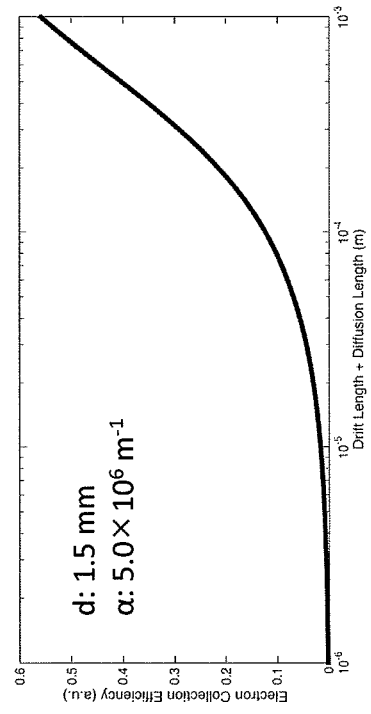

To evaluate the photodetection capability of the narrow band photodetectors, a MAPbBr$_3$ single crystal with a thickness of 1.2 mm was used to measure device performance. FIG. 4A shows the device dark current and photocurrent under white light illumination of 0.4 mW/cm$^2$. The device can repeatedly produce stable photocurrent and dark current output. The absence of obvious ion migration can be explained by the absence of a grain boundary in the single crystals and the very small electric field applied. The EQE spectra under different voltage bias are shown in FIG. 4B, which shows a single narrow peak at 570 nm with EQE peak approaching 3% under −4 V bias. The EQE can be increased by 4 to 5 times using a much more transparent electrode than the opaque thin gold that was used in this example. The off resonance (e.g., peak-to-visible) rejection ratio is larger than 200, limited by the noise level of the IPCE system. The noise of the devices was measured using a Fast Fourier Transform (FFT) analyzer. It is observed in the inset of FIG. 4C that the noise is around 0.1 pA/Hz$^{1/2}$ under −4 V, and is frequency independent. This value is very close to the shot noise limit ($i_s$) calculated from the dark current by the equation:

$$i_s = \sqrt{2qI_dB}, \tag{7}$$

where $I_d$ is the dark current, and B is the bandwidth. The white noise, instead of 1/f noise, dominated the total noise, which indicates the low bulk trap density of the perovskite single crystals, in accordance with previous reports. Based on the measured EQE and noise, the specific detectivity (D*) of the device is calculated. As shown in FIG. 4C, the peak specific detectivity is above $2 \times 10^{10}$ Jones at 570 nm under −4 V bias. To verify this calculated specific detectivity, the noise measurement equipment was used to directly measure the noise equivalent power (NEP) of the device, which is similar to the process used to measure the noise of the device but under the modulated illumination with tuned light intensities. It is shown in FIG. 4D that the photocurrent signal peak in the current spectrum measured by the FFT analyzer gradually decreased with the light intensity, and the lowest detectable light intensity is around 80 pW/cm$^2$. The NEP is comparable to that of commercial InGaAs photodetectors despite the much lower D*, which should be ascribed to the much better linear response of these perovskite photodetectors than InGaAs photodetectors due to the much lower bulk charge trap density in the hybrid perovskite materials. Finally, the response speed of the device was measured by recording the current response at −4 V bias to the frequency modulated light (e.g., 570 nm) illumination with an oscilloscope, and the typical response waveform at 150 Hz is shown in FIG. 4E. By recording the amplitude change of the waveform at different frequencies, the 3 dB cutoff frequency ($f_{3\ dB}$) of the device is calculated to be around 700 Hz (FIG. 4F). The response speed of the present device is determined by the charge transit time across the single crystal, and the bandwidth was increased to 1600 Hz by reducing the crystal thickness to 0.9 mm (see, FIG. 11). This result highlights that it is possible to further increase the device response speed to even above MHz by using crystals with larger carrier mobility and smaller thickness. With reference to FIG. 11, the device response time can be roughly estimated by calculating the electron transit time (t) with the expression of t=d$^2$/μV, where d is the crystal thickness (1.2 mm), μ is the electron mobility, and V is the applied bias (−4 V). The calculated electron transit time is 1.56 ms, which corresponds to a bandwidth of around 630 Hz, quite close to the bandwidth of 700 Hz of our devices. We have also tested the bandwidth of another crystal with smaller thickness of 0.9 mm under −4 V bias, and the corresponding response as a function of the input signal frequency is shown in FIG. 11. It is noted that the 3 dB bandwidth is increased to around 1600 Hz. The bandwidth increment ratio (2.3) is comparable to the square of the thickness reduction ratio (1.8), again indicating the electron and hole transit model should be valid in this case.

The low air stability of the hybrid perovskite materials has been a major concern for their practical application. Here the EQE spectra change of the non-encapsulated MAPbBr$_3$ and MAPbBr$_x$Cl$_{3-x}$ (Cl/Br precursor ratio: 1:1) single crystal devices was monitored after storage in air for one month and three days, respectively. It is shown in FIG. 12 that the EQE spectra remained almost unchanged after prolonged exposure to air for both single halide and mixed halide perovskite single crystals, demonstrating their good air stability compared to the polycrystalline thin film counterparts. For FIG. 12, the MAPbBr$_3$ and MAPbBr$_x$Cl$_{3-x}$ (Cl/Br precursor ratio:

1:1) devices were stored in dark environment in air with temperature of 20~25° C. and relative humidity between 20~60%. The typical EQE spectra under −4 V bias of the MAPbBr$_3$ devices before and after one month storage and MAPbBr$_x$Cl$_{3-x}$ devices before and after three days storage are shown in FIGS. 12A and 12B, respectively.

EXPERIMENTAL EXAMPLES

Material Synthesis and Characterization

Mixed-halide perovskite single crystals were grown by precipitating the crystals in a supersaturated precursor solution with gradually lowered temperature. Lead(II) acetate trihydrate (99%, Alfa Aesar) was fully dissolved in water in a closed 20 mL bottle with a concentration of 0.82 M, and heated to 100° C. in an oil bath. A mixed haloid acid was prepared by mixing Hydrochloric acid (37% w/w aq. soln., Sigma-Aldrich) with Hydrobromic acid (48% w/w aq. soln., Sigma-Aldrich) or mixing Hydrobromic acid with Hydriodic acid (57% w/w aq. soln., stab with 1.5% hypophosphorous acid, Alfa Aesar) with different molar ratios. Then 4.3 mL of Methylamine (40% w/w aq. soln., Alfa Aesar) was mixed with 8.5 mL of mixed haloid acid in another closed 20 mL bottle and heated to 100° C. in an oil bath. After that, 2.5 mL Lead(II) acetate solution (0.82 M) was added in the above blend solution dropwisely to form the mixed-halide perovskite, and the precipices were fully dissolved to form a clear solution after being kept in 100° C. oil bath for one day. Then the solution temperature was gradually decreased with the rate of about 3° C. per day to precipitate the mixed-halide perovskite single crystals.

Powder XRD measurements were performed with a Rigaku D/Max-B X-ray diffractometer with Bragg-Brentano parafocusing geometry, a diffracted beam monochromator, and a conventional cobalt target X-ray tube set to 40 kV and 30 mA. The samples were prepared by grinding one piece of single crystal to fine powders. The absorption spectra of the single crystals were recorded by an Evolution 201 UV-Visible Spectrophotometer. The PL measurement was carried out on a Horiba 320 PL system with a 337 nm UV laser as the excitation source.

Device Fabrication and Characterization

For the photodetector fabrication, a thin layer of Au (25 nm) was thermally evaporated on top of the single crystals as the semi-transparent anode, and the Ga on the glass substrate was contacted to the bottom of the crystals as the cathode. After that, the substrate was cooled down to 0° C. to solidify the Ga electrode.

The device EQE was measured with a Newport QE measurement kit by focusing a monochromatic beam of light onto the devices, and the light modulation frequency was set to 35 Hz. A Keithley 2400 Source-Meter was used for the dark current and photocurrent measurement. The total noise current was measured using a low noise current preamplifier (Stanford SR570) and a Fast Fourier Transform (FFT) spectrum analyzer (Agilent 35670A) at the bias of −4 V. The noise equivalent power was directly measured by illuminating the device with a function generator modulated 570 nm light emitting diode (LED) at 7 Hz with the light intensity changed by Newport neutral density filters, and calibrated by a commercial Si photodiode (Hamamatsu, S2387-33R) at each light intensity. The corresponding signal at a bias of −4 V was amplified by the current preamplifier and recorded by the FFT spectrum analyzer. The temporal response of the device was measured by illuminating the device with a function generator modulated 570 nm LED (6 µW/cm$^2$) at different frequencies under −4 V bias, and the transient photocurrent signal was first amplified by the current preamplifier, and then recorded using a digital oscilloscope (Agilent DSO-X 3104A).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments are described herein. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this disclosure is intended to include all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

The invention claimed is:

1. A photodetector, comprising:
a first electrode;
a second electrode; and
a single crystal perovskite (SCP) disposed between the first electrode and the second electrode;
wherein the SCP includes a halide composition selected to provide a narrow-band photodetection response for the SCP of less than about 20 nm full-width-at-half-maximum (FWHM) for light impinging on the SCP having a specific wavelength within a visible wavelength range.

2. The photodetector of claim 1, wherein the SCP is a perovskite having a structure of AMX$_3$, wherein A is methylammonium (CH$_3$NH$_3^+$), Cs$^+$, formamidinum (H$_2$NCHNH$_2^+$) or a mixture thereof, M is a metal cation, and X is a halide anion, thiocyanate (SCN$^-$) or mixture thereof.

3. The photodetector of claim 1, wherein the SCP has a thickness of between about 100 nm and about 2.0 mm.

4. The photodetector of claim 1, wherein the first and second electrodes each have a thickness of between about 10 nm and about 2 mm.

5. The photodetector of claim 1, wherein the second electrode includes a transparent or semi-transparent material selected from the group consisting of metal films, conductive polymers, carbon nanotubes, graphene, organic or inorganic transparent conducting films (TCFs), a network of metal nanowires, and transparent conducting oxides (TCOs).

6. The photodetector of claim 1, further including a thin layer of a material between the second electrode, which serves as an anode, and the SCP, wherein the thin layer of material enhances a defect density on or near a surface of the SCP proximal to the second electrode.

7. The photodetector of claim 1, further comprising:
a first buffer layer disposed between the SCP and the first electrode;
and a second buffer layer disposed between the SCP and the second electrode, the first buffer layer having a higher hole conductivity than the second buffer layer, the second buffer layer having a higher electron conductivity than the first buffer layer.

8. The photodetector of claim 7, wherein the first buffer layer comprises at least one of poly(3,4-ethylenedioxithiophene) (PEDOT) doped with poly(styrene sulfonicacid) (PSS), 4,4' bis[(ptrichlorosilylpropylphenyl)phenylaminoThiphenyl (TPD-Si2), polyvinylcarbazole (PVK), poly(3-hexylthiophene) (P3HT), poly(3-hexyl-2,5-thienylene vinylene) (P3HTV), copper phthalocyanine (CuPc), poly[3,4-(1hydroxymethyl)ethylenedioxythiophene] (PHEDOT), n-dodecylbenzenesulfonic acid/hydrochloric acid-doped poly(aniline) nanotubes (a-PANIN)s, poly(styrenesulfonic acid)-graft-poly(aniline) (PSSA-g-PANI), poly[(9,9-dioctyl-fluorene)-co-N-(4-(1-methylpropyl)phenyl)diphenylamine] (PFT), 4,4'-bis[(p-trichlorosilylpropylphenyl) phenylamino] biphenyl (TSPP), 5,5'-bis[(p-trichlorosilylpropylphenyl) phenylamino]-2,20-bithiophene (TSPT), N-propyltriethoxysilane, 3,3,3-trifluoropropyltrichlorosilane or 3-aminopropyltriethoxysilane, $V_2O_5$, $VO_x$, $MoO_3$, $WO_3$, $ReO_3$, NiOx, AgOx/PEDOT:PSS, $Cu_2O$, CuSCN/P3HT, or Au nanoparticles.

9. The photodetector of claim 7, wherein the second buffer layer includes at least one of LiF, CsF, $LiCoO_3$, $CS_2CO_3$, $TiO_x$, $TiO_2$, $SnO_x$, ZnO, $Al_2O_3$, CaO, bathocuproine (BCP), copper phthalocyanine (CuPc), pentacene, pyronin B, [6,6]-phenyl C61-butyric acid methyl ester (PCBM), [6,6]-phenyl C71-butyric acid methyl ester (PC70BM), pentadecafluorooctyl phenyl-C60-butyrate (F-PCBM), C60, C60/LiF, ZnO/PCBM, ZnO/cross-linked fullerene derivative (C-PCBSD), single walled carbon nanotubes (SWCNT), poly(ethylene glycol) (PEG), poly(dimethylsiloxaneblock-methyl methacrylate) (PDMS-b-PMMA), polar polyfluorene (PF-EP), polyfluorene bearing lateral amino groups (PFN), polyfluorene bearing quaternary ammonium groups in the side chains (WPF-oxy-F), polyfluorene bearing quaternary ammonium groups in the side chains (WPF-6-oxy-F), fluorene alternating and random copolymer bearing cationic groups in the alkyl side chains (PFNBr-DBTI5), fluorene alternating and random copolymer bearing cationic groups in the alkyl side chains (PFPNBr), or poly(ethylene oxide) (PEO).

10. A method of making a photodetector having a narrow-band photodetection response of less than about 20 nm full-width-at-half maximum (FWHM) for light impinging on the SCP having a specific wavelength within a visible wavelength range, the method comprising:
providing a first electrode layer;
attaching a single crystal perovskite (SCP) to the first electrode layer, wherein the SCP includes a halide composition selected to provide a narrow-band photodetection response for the SCP of less than about 20 nm full-width-at-half-maximum (FWHM) for light impinging on the SCP having the specific visible wavelength; and
forming a second electrode layer on the SCP.

11. The method of claim 10, wherein the SCP is a perovskite having a structure of $AMX_3$, wherein A is methylammonium ($CH_3NH_3^+$), $Cs^+$, formamidinum ($H_2NCHNH_2^+$) or a mixture thereof, M is a metal cation, and X is a halide anion, thiocyanate ($SCN^-$) or mixture thereof.

12. The method of claim 10, wherein the SCP has a thickness of between about 100 nm and about 2 mm.

13. The method of claim 10, wherein the first and second electrode layers each have a thickness of between about 100 nm and about 2 mm.

14. The method of claim 10, wherein the second electrode includes a transparent or semi-transparent material selected from the group consisting of metal films, conductive polymers, carbon nanotubes, graphene, organic or inorganic transparent conducting films (TCFs), a network of metal nanowires, and transparent conducting oxides (TCOs).

15. The method of claim 10, further including enhancing a defect density on or near a surface of the SCP proximal to the second electrode layer.

16. The method of claim 15, wherein enhancing includes adding a thin layer of a material to the SCP prior to forming the second electrode layer.

17. A photodetector device, comprising:
a first electrode;
a second electrode;
a semiconductor photoactive layer between the first electrode and the second electrode; and
a charge quenching layer between the first electrode and the photoactive layer,
wherein the semiconductor photoactive layer and the charge quenching layer have a same material composition, and wherein the charge quenching layer has a higher density of charge quenching defects than the semiconductor photoactive layer.

18. The photodetector device of claim 17, wherein the charge quenching layer comprises a region of the semiconductor photoactive material modified to have the higher defect density.

19. The photodetector device of claim 17, wherein the charge quenching layer comprises at least one of single crystal perovskite, polycrystalline perovskite, zinc oxide ($ZnO_x$), titanium oxide ($TiO_x$), tin oxide ($SnO_x$), zinc sulfide (ZnS), cadmium sulfide (CdS), lead sulfides (PbS), iron sulfide (FeS), iron pyrite ($FeS_2$), cadmium selenide (CdSe), lead selenide (PbSe), cadmium telluride (CdTe), lead telluride (PbTe), InAs, GaN, InSb, $Pb_{1-x}Sn_xTe$, $Hg_{1-x}Cd_xTe$, InAsSb, graphene quantum dots, carbon nanotubes, or fullerenes, and wherein the photoactive layer comprises at least one of single crystal perovskite, polycrystalline perovskite, Si, Ge, zinc oxide ($ZnO_x$), titanium oxide ($TiO_x$), tin oxide ($SnO_x$), zinc sulfide (ZnS), cadmium sulfide (CdS), lead sulfides (PbS), iron sulfide (FeS), iron pyrite ($FeS_2$), cadmium selenide (CdSe), lead selenide (PbSe), cadmium telluride (CdTe), lead telluride (PbTe), InAs, GaN, InSb, $Pb_{1-x}Sn_xTe$, $Hg_{1-x}Cd_xTe$, InAsSb.

20. The photodetector device of claim 17, wherein the photoactive layer comprises at least one of polyvinylcarbazole (PVK), poly(3-hexylthiophene) (P3HT), poly[4,8-bis-(2-ethyl-hexyl-thiophene-5-yl)-benzo[1,2-b:4,5-b4,5-bxyl-thiophene) (P3HT), poly[4,8-bis-(2-ethyl-hexyl-tho[3,4-b] thiophen-4,6-diyl (PBDTTT-CT), phthalocyanine complex, a porphyrin complex, a polythiophene (PT), a derivative of polythiophene, a polycarbazole, a derivative of polycarbazole, a poly(p-phenylene vinylene) (PPV), a derivative of poly(p-phenylene vinylene), a polyfluorene (PF), a derivative of polyfluorene, a cyclopentadithiophene-based polymer, a benzodithiophene (BDT)-based polymer, a polythiophene, a derivative of polythiophene, a polycarbazole, a derivative of polycarbazole, poly(3-octylthiophene) (P3OT), poly(3-hexyloxythiophene) (P3DOT), poly(3-methylthiophene) (PMeT), poly(3-dodecylthiophene) (P3DDT), poly(3-dodecylthienylenevinylene) (PDDTV), poly(3,3 dialkylquarterthiophene) (PQT), poly-dioctyl-fluorene-co-bithiophene (F8T2), poly-(2,5,-bis(3-alkylthiophene-2-yl)thieno[3,2-b]thiophene) (PBTTT-C12), poly[2,7-(9,9[2,7-(9,9,7-(9,97-(9,9-bis(31y-(2,5,-bis(3F8T2), poly-(2,5,-bis(3kylquarterthiophene) (PQT), poly-dioctyl-fluorene-co-bithiophene (F8T2), poly-(2,5,-bis(3-alkylthiophene-2-yl)thieno[3,2-b]thiophene) (PBTTT-C12), poly[2,7-(9,9'-dihexylfluorene)-alt-2,3-dimethyl-5,7-dithien-2-yl-2,1,3-benzothiadiazole] (PFDDTBT), poly {[2,7-(9,9-bis-(2-ethylhexyl)-fluorene)]-alt-[5,5-(4,7-di-20-thienyl-2,1,3-benzothiadiazole)]} (BisEH-PFDTBT), poly{[2,7-(9,9-bis-(3,7-dimethyl-octyl)-fluorene)]-alt-[5,5-(4,7-di-20-thienyl-2,1,3-benzothiadiazole)]} (BisDMO-PFDTBT), poly[N-9''-hepta-decanyl-2,7-carbazole-alt-5,5-(4',7'-di-2-thienyl-2',1',3'-benzothiadiazole)] (PCDTBT), or a combination of two or more of the above materials.

21. The photodetector device of claim 17, wherein the charge quenching layer comprises a separate layer of the same material composition deposited or formed on the semiconductor photoactive material.

22. A photodetector, comprising:
a first electrode;
a second electrode; and
a polycrystalline perovskite (PCP) film disposed between the first electrode and the second electrode;
wherein the PCP film includes a halide composition selected to provide a narrow-band photodetection response for the PCP film of less than about 20 nm full-width-at-half-maximum (FWHM) for light impinging on the PCP film having a specific wavelength within a visible wavelength range.

23. The photodetector of claim 22, wherein the PCP is a perovskite having a structure of $AMX_3$, wherein A is methylammonium ($CH_3NH_3^+$), $Cs^+$, formamidinum ($H_2NCHNH_2^+$) or a mixture thereof, M is a metal cation, and X is a halide anion, thiocyanate ($SCN^-$) or mixture thereof.

24. The photodetector of claim 19, wherein the PCP film has a thickness of between about 100 nm and about 1.0 mm.

* * * * *